US012620984B2

(12) United States Patent
    Kumazawa

(10) Patent No.: US 12,620,984 B2
(45) Date of Patent: May 5, 2026

(54) SEMICONDUCTOR DEVICE

(71) Applicant: FUJI ELECTRIC CO., LTD.,
    Kawasaki (JP)

(72) Inventor: Yuki Kumazawa, Matsumoto-city (JP)

(73) Assignee: FUJI ELECTRIC CO., LTD.,
    Kawasaki (JP)

( * ) Notice: Subject to any disclaimer, the term of this
    patent is extended or adjusted under 35
    U.S.C. 154(b) by 56 days.

(21) Appl. No.: 18/423,567

(22) Filed: Jan. 26, 2024

(65) Prior Publication Data

US 2024/0313763 A1     Sep. 19, 2024

(30) Foreign Application Priority Data

Mar. 17, 2023    (JP) ................................. 2023-042470

(51) Int. Cl.
    H03K 17/082 (2006.01)
    H03K 17/08 (2006.01)
    H03K 17/14 (2006.01)

(52) U.S. Cl.
    CPC ......... H03K 17/0828 (2013.01); H03K 17/14
        (2013.01); *H03K 2017/0806* (2013.01); *H03K*
                           *2217/0027* (2013.01)

(58) Field of Classification Search
    CPC ............... H03K 17/0828; H03K 17/14; H03K
                       2017/0806; H03K 2217/0027
    See application file for complete search history.

(56) References Cited

U.S. PATENT DOCUMENTS

| | | | | |
|---|---|---|---|---|
| 12,132,392 | B2 * | 10/2024 | Nakamori | ............. H02M 1/088 |
| 2019/0190369 | A1 | 6/2019 | Nakamori | |
| 2019/0326898 | A1 | 10/2019 | Taguchi | |
| 2021/0288571 | A1 | 9/2021 | Nakamori | |

FOREIGN PATENT DOCUMENTS

| | | | | |
|---|---|---|---|---|
| JP | 3842061 | B2 * | 11/2006 | ............ H02M 3/156 |
| JP | 2019-110677 | A | 7/2019 | |
| JP | 2019-193410 | A | 10/2019 | |
| WO | 2020/255640 | A1 | 12/2020 | |
| WO | WO-2023286464 | A1 * | 1/2023 | ....... H03K 17/08122 |

* cited by examiner

*Primary Examiner* — Lincoln D Donovan
*Assistant Examiner* — James G Yeaman
(74) *Attorney, Agent, or Firm* — Rabin & Berdo, P.C.

(57) ABSTRACT

A semiconductor device includes a switching element performing a switching base on an input signal to operate a load, a detection circuit outputting a release signal upon detecting a predetermined state of the switching element, and a driving current control circuit including a latch circuit that latches a detection result obtained from a magnitude of a current flowing through the switching element and to be reset upon receiving the release signal from the detection circuit. The control circuit outputs, based on an output of the latch circuit a first driving current or a second driving current larger than the first driving current. The driving current is used for charging a gate capacitance of the switching element in an operation state of the semiconductor device. The control circuit sets the driving current to the first driving current upon the latch circuit being reset by the release signal.

9 Claims, 18 Drawing Sheets

GATE VOLTAGE Vg:
5V/div

SENSE VOLTAGE Vs:
2V/div

COLLECTOR-EMITTER
VOLTAGE Vce: 100V/div

COLLECTOR-EMITTER
VOLTAGE Vce: 100V/div

COLLECTOR CURRENT Ic:
200A/div

21a LATCH CIRCUIT

21a1 s2 — D Q — Lt

Vin — CLK

CLR

CL

SEMICONDUCTOR DEVICE

CROSS-REFERENCE TO RELATED APPLICATION

This application is based upon and claims the benefit of priority of the prior Japanese Patent Application No. 2023-042470, filed on Mar. 17, 2023, the entire contents of which are incorporated herein by reference.

BACKGROUND OF THE INVENTION

1. Field of the Invention

The embodiment discussed herein relates to a semiconductor device.

2. Background of the Related Art

Semiconductor devices, such as intelligent power modules (IPMs), include power conversion switching elements such as insulated gate bipolar transistors (IGBTs). Furthermore, in recent years, an IPM having the function of controlling the magnitude of a driving current for charging an IGBT according to a collector current flowing through the IGBT has been developed.

For example, a technique for adjusting driving capability by detecting a current flowing between the two main electrodes of a semiconductor switching element at timing at which the semiconductor switching element is turned off was proposed as a related art (see, for example, International Publication Pamphlet No. WO 2020/255640). Furthermore, a technique for using a plurality of comparators which compare an output voltage of a temperature detection means for detecting an operating temperature of a power semiconductor switching element with different reference voltages, for latching comparison results of the plurality of comparators, and for selectively outputting a comparison result was proposed (see, for example, Japanese Laid-open Patent Publication No. 2019-110677). In addition, a technique for using a state distinction circuit which latches current and temperature states and for releasing a latch by a reset signal was proposed (see, for example, Japanese Laid-open Patent Publication No. 2019-193410).

SUMMARY OF THE INVENTION

According to an aspect, there is provided a semiconductor device, including: a switching element configured to perform a switching on a basis of an input signal to operate a load; a detection circuit configured to output a release signal upon detecting a predetermined state of the switching element; and a driving current control circuit including a latch circuit configured to latch a detection result obtained from a magnitude of a current flowing through the switching element and to be reset upon receiving the release signal from the detection circuit, and being configured to output, on a basis of an output of the latch circuit, a driving current including a first driving current or a second driving current larger than the first driving current, the driving current being used for charging a gate capacitance of the switching element in an operation state of the semiconductor device, wherein the driving current control circuit sets the driving current to the first driving current upon the latch circuit being reset by the release signal.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

An embodiment will now be described with reference to the accompanying drawings. Components in the specification and the drawings having substantially the same function are marked with the same numeral. By doing so, a duplicate description may be omitted.

Figure 1:
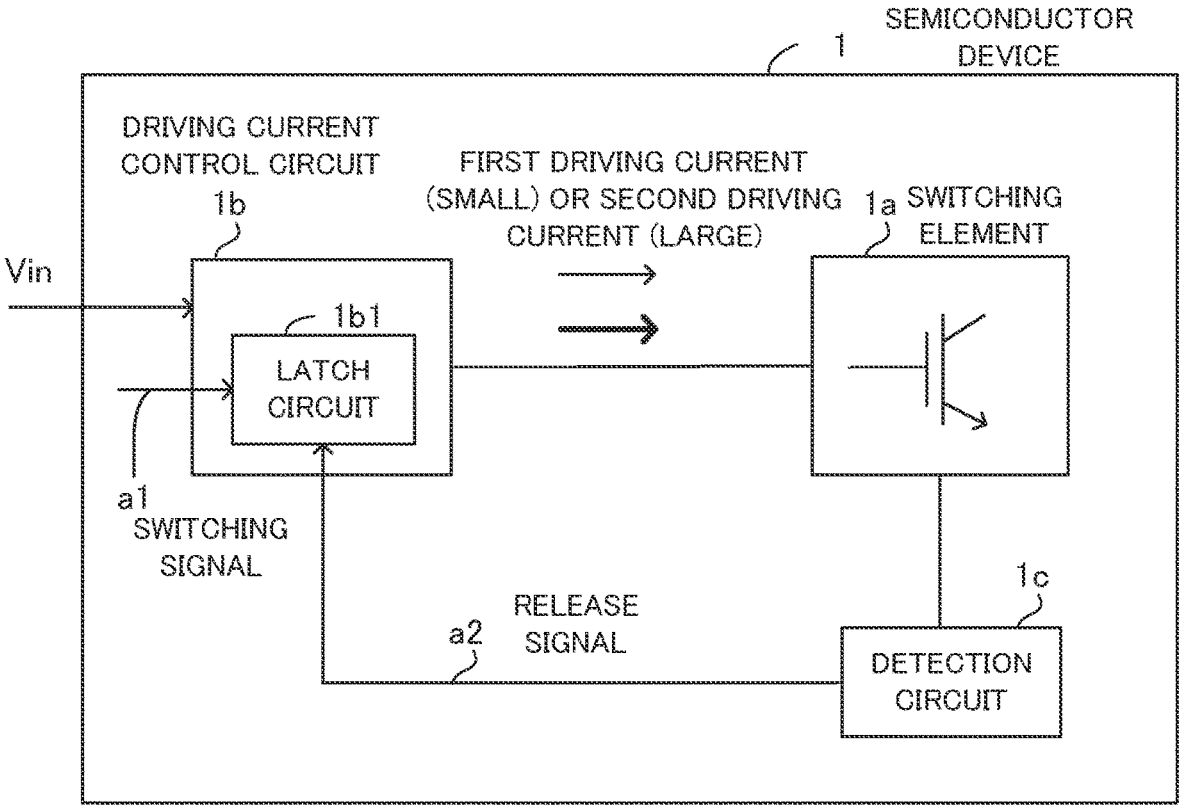
FIG. 1 is a view for describing an example of a semiconductor device.

FIG. 1 is a view for describing an example of a semiconductor device. A semiconductor device 1 includes a switching element 1a, a driving current control circuit 1b, and a detection circuit 1c. The switching element 1a is an IGBT or the like. Furthermore, the driving current control circuit 1b includes a latch circuit 1b1.

The switching element 1a performs switching on the basis of an input signal Vin to operate a load. The latch circuit 1b1 latches a switching signal a1 for changing the magnitude of a driving current (gate current) used for charging a gate capacitance (gate-emitter capacitance) of the switching element 1*a* according to the magnitude of a current flowing through the switching element 1*a*. When the switching element 1*a* is in a determined state, a latch state is released on the basis of a release signal a2.

The driving current control circuit 1*b* controls the magnitude of a driving current on the basis of the switching signal a1 latched in a device operation state. The detection circuit 1*c* detects the determined state of the switching element 1*a* and outputs the release signal a2.

When the gate capacitance of the switching element 1*a* is charged, the driving current control circuit 1*b* generates a first driving current and a second driving current larger than the first driving current. When the latch state of the latch circuit 1*b*1 is released by the release signal a2, the driving current control circuit 1*b* sets the magnitude of a driving current to the first driving current on the basis of an output of the latch circuit 1*b*1 after the release.

By adopting the structure of the above semiconductor device 1, the switching element 1*a* is charged with the first driving current which is the smaller of the two controllable driving currents when the semiconductor device 1 is operated again. This prevents the switching element 1*a* from being charged with the second driving current larger than the first driving current. As a result, a short-circuit current at the time of the occurrence of a short circuit is suppressed. Furthermore, noise at normal operation time is suppressed.

Figure 2:
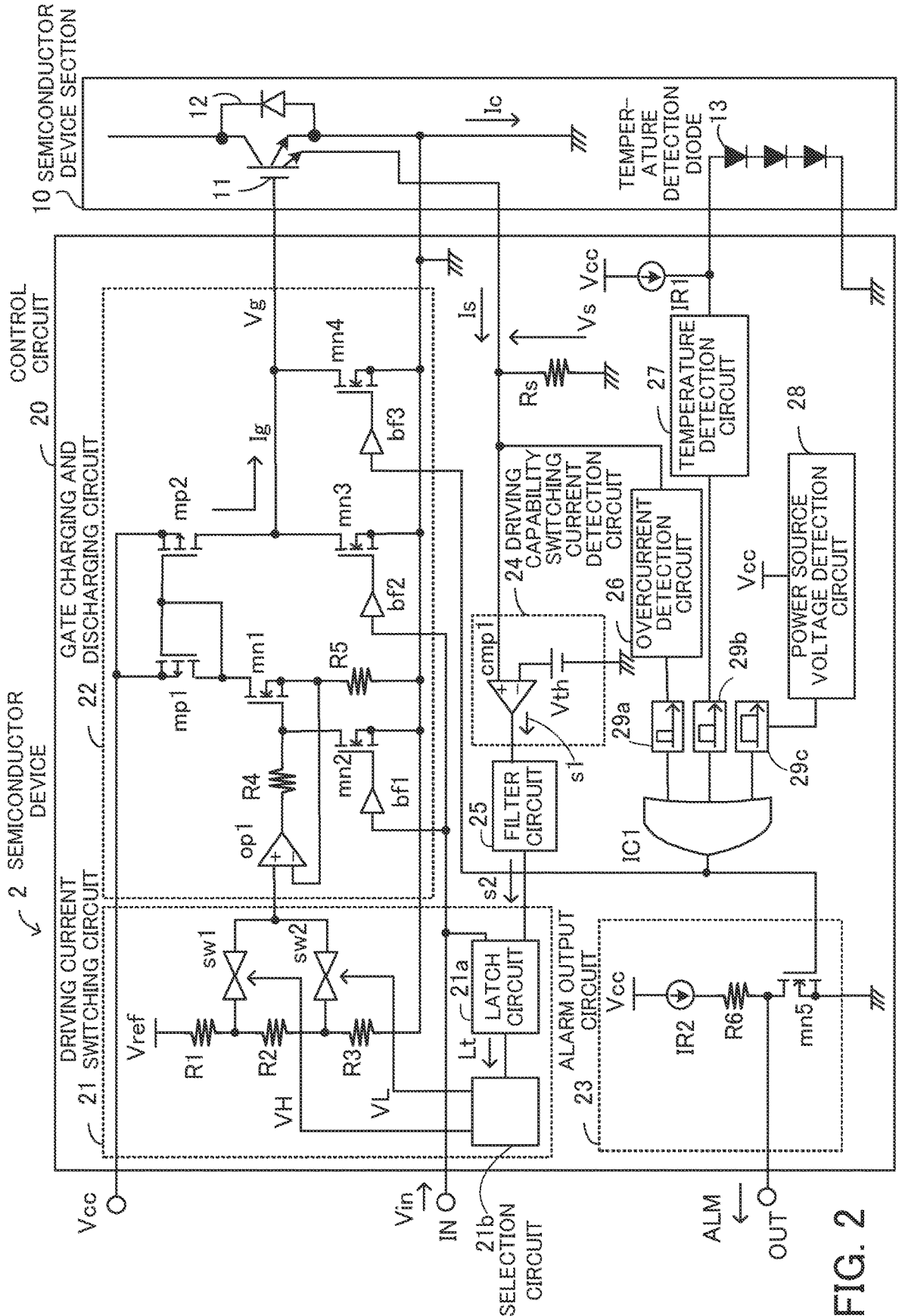
FIG. 2 illustrates an example of the structure of a semiconductor device that does not have a latch release condition.

A semiconductor device that does not have a latch release condition for a latch circuit will now be described with reference to FIGS. 2 through 7. FIG. 2 illustrates an example of the structure of a semiconductor device that does not have a latch release condition. A semiconductor device 2 includes a semiconductor device section 10 and a control circuit 20. The semiconductor device section 10 includes an IGBT 11, a diode 12, and a temperature detection diode 13.

The IGBT 11 turns on, on the basis of an input signal Vin input to the control circuit 20, passes a collector current Ic from a collector to an emitter, and supplies a constant power to a load (not illustrated). The diode 12 is connected in inverse parallel with a direction in which the collector current Ic flows through the IGBT 11 and functions as a freewheeling diode (FWD) which circulates a load current flowing at this time through the load.

The emitter of the IGBT 11 is connected to a reference potential (hereinafter referred to as GND). Furthermore, a sense current Is is output from a sense emitter of the IGBT 11 at a fixed ratio according to the collector current Ic. The temperature detection diode 13 is made up of a plurality of diodes and is a temperature detection element for detecting the temperature of the IGBT 11.

The control circuit 20 exercises drive control and protection control of the IGBT 11. Furthermore, the control circuit 20 has the function of controlling the magnitude of a driving current (gate current) Ig used for driving the IGBT 11 according to the magnitude of the sense current Is output from the sense emitter of the IGBT 11.

The control circuit 20 includes a driving current switching circuit 21, a gate charging and discharging circuit 22, an alarm output circuit 23, a driving capability switching current detection circuit 24, a filter circuit 25, an overcurrent detection circuit 26, a temperature detection circuit 27, a power source voltage detection circuit 28, one-shot circuits 29*a*, 29*b*, and 29*c*, a logical OR element IC1 with three inputs and one output, a sense resistor Rs, and a constant-current source IR1.

The driving current switching circuit 21 includes a latch circuit 21*a*, a selection circuit 21*b*, resistors R1, R2, and R3, and switches sw1 and sw2. Furthermore, the gate charging and discharging circuit 22 includes an operational amplifier op1, resistors R4 and R5, PMOS transistors mp1 and mp2, NMOS transistors mn1, mn2, mn3, and mn4, and buffers bf1, bf2, and bf3. In addition, the alarm output circuit 23 includes a resistor R6, an NMOS transistor mn5, and a constant-current source IR2.

Each element is connected in the flowing way. An external terminal IN to which the input signal Vin for the IGBT 11 is input is connected to one input end of the latch circuit 21*a* and an input end of each of the buffers bf1 and bf2. An output end of the latch circuit 21*a* is connected to an input end of the selection circuit 21*b*. A selection signal VH output from the selection circuit 21*b* is input to a switch control terminal of the switch sw1 and a selection signal VL output from the selection circuit 21*b* is input to a switch control terminal of the switch sw2.

A voltage Vref generated from a power source voltage Vcc is applied to one end of the resistor R1. The other end of the resistor R1 is connected to one end of the resistor R2 and an input end of the switch sw1. The other end of the resistor R2 is connected to one end of the resistor R3 and an input end of the switch sw2. An output end of the switch sw1 is connected to an output end of the switch sw2 and a non-inverting input terminal (+) of the operational amplifier op1.

The power source voltage Vcc is applied to sources of the PMOS transistors mp1 and mp2. A gate of the PMOS transistor mp1 is connected to a gate of the PMOS transistor mp2, a drain of the PMOS transistor mp1, and a drain of the NMOS transistor mn1.

An output end of the operational amplifier op1 is connected to one end of the resistor R4 and an inverting input terminal (−) of the operational amplifier op1 is connected to a source of the NMOS transistor mn1 and one end of the resistor R5. The other end of the resistor R4 is connected to a gate of the NMOS transistor mn1 and a drain of the NMOS transistor mn2. A gate of the NMOS transistor mn2 is connected to an output end of the buffer bf1.

The other end of the resistor R3 is connected to a source of the NMOS transistor mn2, the other end of the resistor R5, a source of the NMOS transistor mn3, a source of the NMOS transistor mn4, the emitter of the IGBT 11, and the GND.

A drain of the PMOS transistor mp2 is connected to a drain of the NMOS transistor mn3, a drain of the NMOS transistor mn4, and a gate of the IGBT 11. A gate of the NMOS transistor mn3 is connected to an output end of the buffer bf2 and a gate of the NMOS transistor mn4 is connected to an output end of the buffer bf3.

An inverting input terminal (−) of a comparator cmp1 included in the driving capability switching current detection circuit 24 is connected to a reference power supply which outputs a threshold voltage Vth, and an output end of the comparator cmp1 is connected to an input end of the filter circuit 25. A non-inverting input terminal (+) of the comparator cmp1 is connected to an input end of the overcurrent detection circuit 26, one end of the sense resistor Rs, and the sense emitter of the IGBT 11. The other end of the sense resistor Rs is connected to the GND.

An input end of the temperature detection circuit 27 is connected to an output end of the constant-current source IR1 and an anode portion of the temperature detection diode 13. The power source voltage Vcc is applied to an input end of the constant-current source IR1 and a cathode portion of the temperature detection diode 13 is connected to the GND.

An output end of the overcurrent detection circuit 26 is connected to an input end of the one-shot circuit 29a, an output end of the temperature detection circuit 27 is connected to an input end of the one-shot circuit 29b, and output end of the power source voltage detection circuit 28 is connected to an input end of the one-shot circuit 29c.

An output end of each of the one-shot circuits 29a, 29b, and 29c is connected to an input end of the logical OR element IC1 and an output end of the logical OR element IC1 is connected to a gate of the NMOS transistor mn5 and an input end of the buffer bf3.

The power source voltage Vcc is applied to an input end of the constant-current source IR2 and an output end of the constant-current source IR2 is connected to one end of the resistor R6. The other end of the resistor R6 is connected to an alarm output terminal OUT and a drain of the NMOS transistor mn5. A source of the NMOS transistor mn5 is connected to the GND.

<Relationships Among Driving Current, Switching Speed, and Noise>

The IGBT 11 is a switching element which is turned on or off by charging or discharging a gate capacitance. When a driving current Ig supplied from the control circuit 20 is small, charging takes a long time. As a result, the switching speed (turn-on speed) of the IGBT 11 is low. In this case, a collector-emitter voltage Vce slowly changes. Accordingly, noise (radiation noise) is decreased. However, switching loss increases.

On the other hand, when the driving current Ig supplied from the control circuit 20 is large, a charging speed is high. As a result, the switching speed of the IGBT 11 is high. In this case, the collector-emitter voltage Vce suddenly changes. Accordingly, noise increases. However, switching loss is decreased.

<Driving Current Control Function>

As stated above, there is a trade-off relationship between noise and switching loss. With the semiconductor device 2, however, this trade-off relationship is optimized by the function of controlling the driving current Ig of the IGBT 11 according to a collector current value of the IGBT 11.

A recovery dv/dt, which is an index of noise, tends to have its maximum value in a small current region, not in a large current region of the collector current Ic flowing through the IGBT 11. Accordingly, with the driving current control function of the semiconductor device 2, the driving current Ig is small in the small current region and the driving current Ig is large in the large current region. This makes it possible to decrease noise while suppressing an increase in loss. As a result, the trade-off relationship between noise and switching loss is optimized.

<Operation of Driving Current Control Function>

Figure 3:
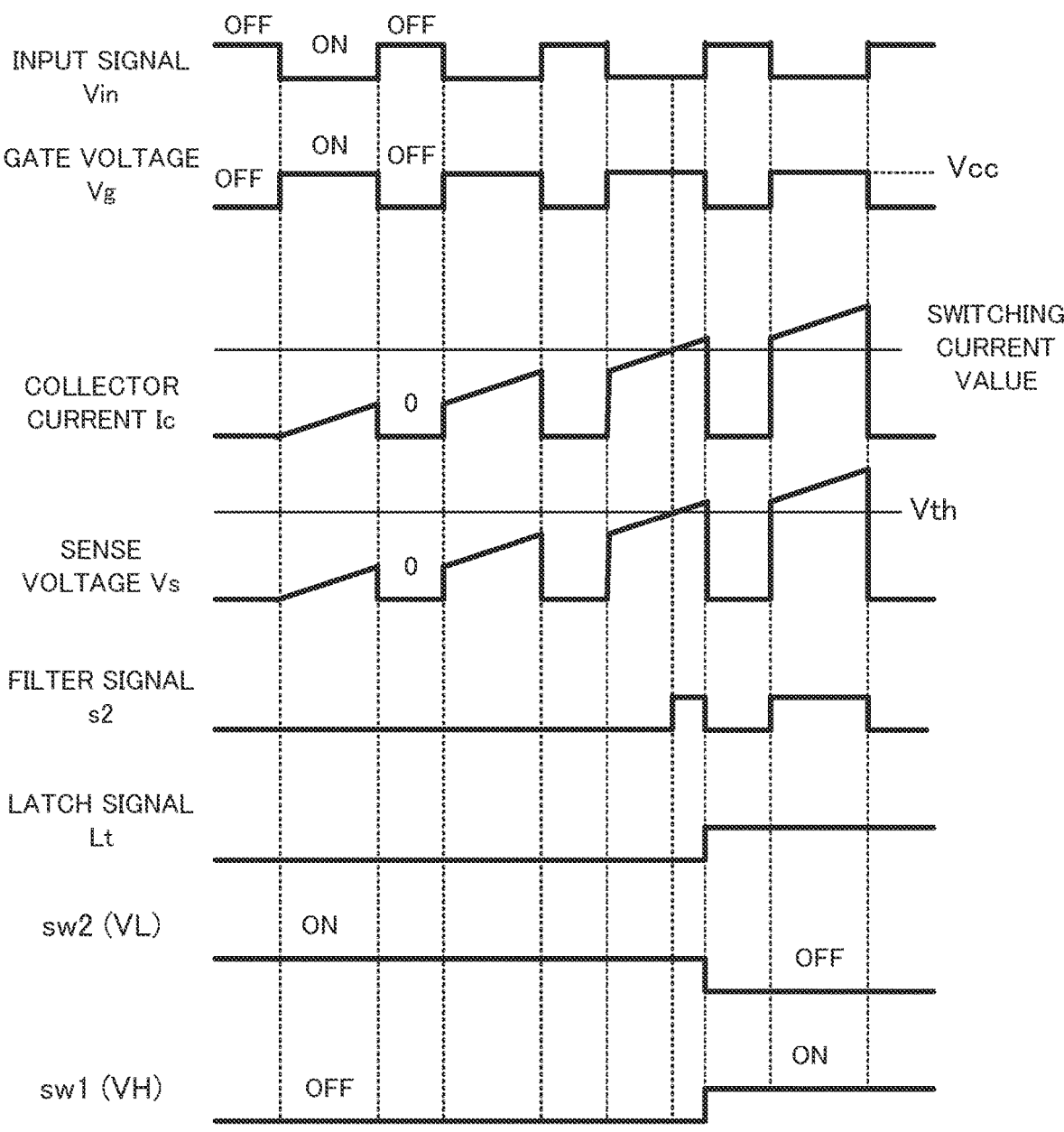
FIG. 3 is a time chart for describing the operation of a driving current control function.

FIG. 3 is a time chart for describing the operation of the driving current control function. When the input signal Vin is at H level (off), a gate voltage Vg of the IGBT 11 is at L level (off) and the IGBT 11 is turned off. Furthermore, when the input signal Vin is at L level (on), the gate voltage Vg of the IGBT 11 is at H level (on) and the IGBT 11 is turned on.

In the driving current control function of the semiconductor device 2, the collector current value is read at the timing when the input signal Vin is turned off. The driving current Ig is made large from the next input signal Vin. For example, after the collector current Ic exceeds a switching current value (threshold current for switching between large and small driving currents), the input signal Vin is turned off. At that timing a latch signal Lt output from the latch circuit 21a becomes H level. When after that the input signal Vin changes from the H level to L level, a large driving current Ig flows through the gate of the IGBT 11. That is to say, when the IGBT 11 is in off state the last time, a latch is performed. When the IGBT 11 is turned on by the next input signal Vin, the driving current Ig is made large.

Specifically, the driving capability switching current detection circuit 24 compares a sense voltage Vs with the threshold voltage Vth. The sense current Is output from the IGBT 11 flows through the sense resistor Rs. As a result, a potential is generated and corresponds to the sense voltage Vs.

When the sense voltage Vs is higher than or equal to the threshold voltage Vth (if the collector current Ic is larger than or equal to the switching current value), the driving capability switching current detection circuit 24 detects that the collector current Ic at which driving capability for the IGBT 11 is to be switched is flowing through the IGBT 11, and outputs an H-level switching signal (second switching signal) s1 to the filter circuit 25.

The filter circuit 25 filters the H-level switching signal s1 and outputs a filter signal s2. The latch circuit 21a latches the filter signal (detection result) s2 and outputs a latch signal Lt. The detection result is obtained by a magnitude of the collector current Ic of the IGBT 11. On the basis of the latch signal Lt, the selection circuit 21b outputs a selection signal VH and a selection signal VL.

When the sense voltage Vs is higher than or equal to the threshold voltage Vth, the selection circuit 21b sets the selection signal VH to H level to turn on the switch sw1, and sets the selection signal VL to L level to turn off the switch sw2. As a result, an applied voltage to the non-inverting input terminal (+) of the operational amplifier op1 is increased and the gate charging and discharging circuit 22 increases the driving current Ig at turn-on time.

Furthermore, when the sense voltage Vs is lower than the threshold voltage Vth, the selection circuit 21b sets the selection signal VH to L level to turn off the switch sw1, and sets the selection signal VL to H level to turn on the switch sw2. As a result, an applied voltage to the non-inverting input terminal (+) of the operational amplifier op1 is decreased and the gate charging and discharging circuit 22 decreases the driving current Ig at turn-on time. By adopting this method, the magnitude of the driving current Ig used for charging the gate is controlled according to a collector current value of the IGBT 11.

<Functions of Protection Against Overcurrent, Overheat, and Voltage and Alarm Function>

The semiconductor device 2 has not only the above driving current control function but also the functions of protection against overcurrent, overheat, and voltage. These functions will now be described.

The sense current Is output from the IGBT 11 flows through the sense resistor Rs. As a result, a potential is generated and corresponds to the sense voltage Vs. The overcurrent detection circuit 26 detects a current state of the IGBT 11 on the basis of the sense voltage Vs. When the overcurrent detection circuit 26 detects that a current state of the IGBT 11 is an overcurrent state, the overcurrent detection circuit 26 outputs an overcurrent detection signal.

The temperature detection circuit 27 detects an overheat state of the IGBT 11. In this case, a constant current output from the constant-current source IR1 flows through the temperature detection diode 13. As a result, a potential is generated. This potential is input to the temperature detection circuit 27 as a temperature detection voltage. The temperature detection circuit 27 detects a temperature state of the IGBT 11 on the basis of the temperature detection voltage. When the temperature detection circuit 27 detects that a temperature state of the IGBT 11 is an overheat state, the temperature detection circuit 27 outputs an overheat detection signal.

The power source voltage detection circuit 28 detects whether the power source voltage Vcc applied from an external terminal is higher than or equal to a determined voltage level. When the power source voltage Vcc is lower than the determined voltage level, the power source voltage detection circuit 28 outputs a voltage level drop signal.

When the one-shot circuit 29*a* receives the overcurrent detection signal, the one-shot circuit 29*a* outputs a one-pulse signal having a first H-level pulse width. When the one-shot circuit 29*b* receives the overheat detection signal, the one-shot circuit 29*b* outputs a one-pulse signal having a second H-level pulse width. When the one-shot circuit 29*c* receives the voltage level drop signal, the one-shot circuit 29*c* outputs a one-pulse signal having a third H-level pulse width. The second H-level pulse width is larger than the first H-level pulse width. The third H-level pulse width is larger than the second H-level pulse width. Magnitude relationships among the first, second, and third H-level pulse widths are not limited to the above setting (magnitude relationships among the first, second, and third H-level pulse widths may be set in reverse order or in another order).

When at least one one-pulse signal is input, the logical OR element IC1 outputs an H-level alarm signal. When the H-level alarm signal output from the logical OR element IC1 is input via the buffer bf3 to the gate of the NMOS transistor mn4, the NMOS transistor mn4 turns on. As a result, the gate voltage (driving voltage) Vg is extracted from the gate of the IGBT 11 and the IGBT 11 turns off and stops driving.

Furthermore, the H-level alarm signal output from the logical OR element IC1 is input to the gate of the NMOS transistor mn5. As a result, the NMOS transistor mn5 turns on and an L-level alarm notice signal ALM is output from the alarm output terminal OUT.

<Increase in Short-circuit Current>

Figure 4:
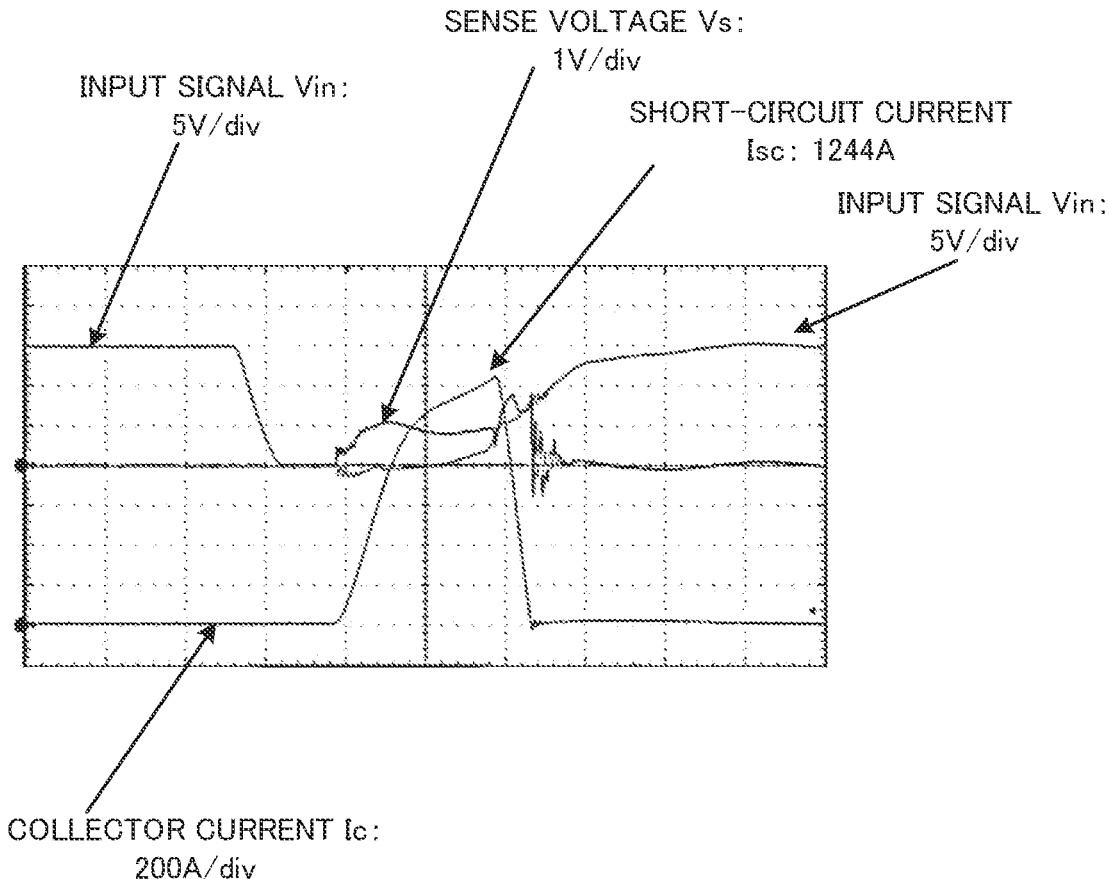
FIG. 4 illustrates an example of a short-circuit waveform of an IGBT.
Figure 5:
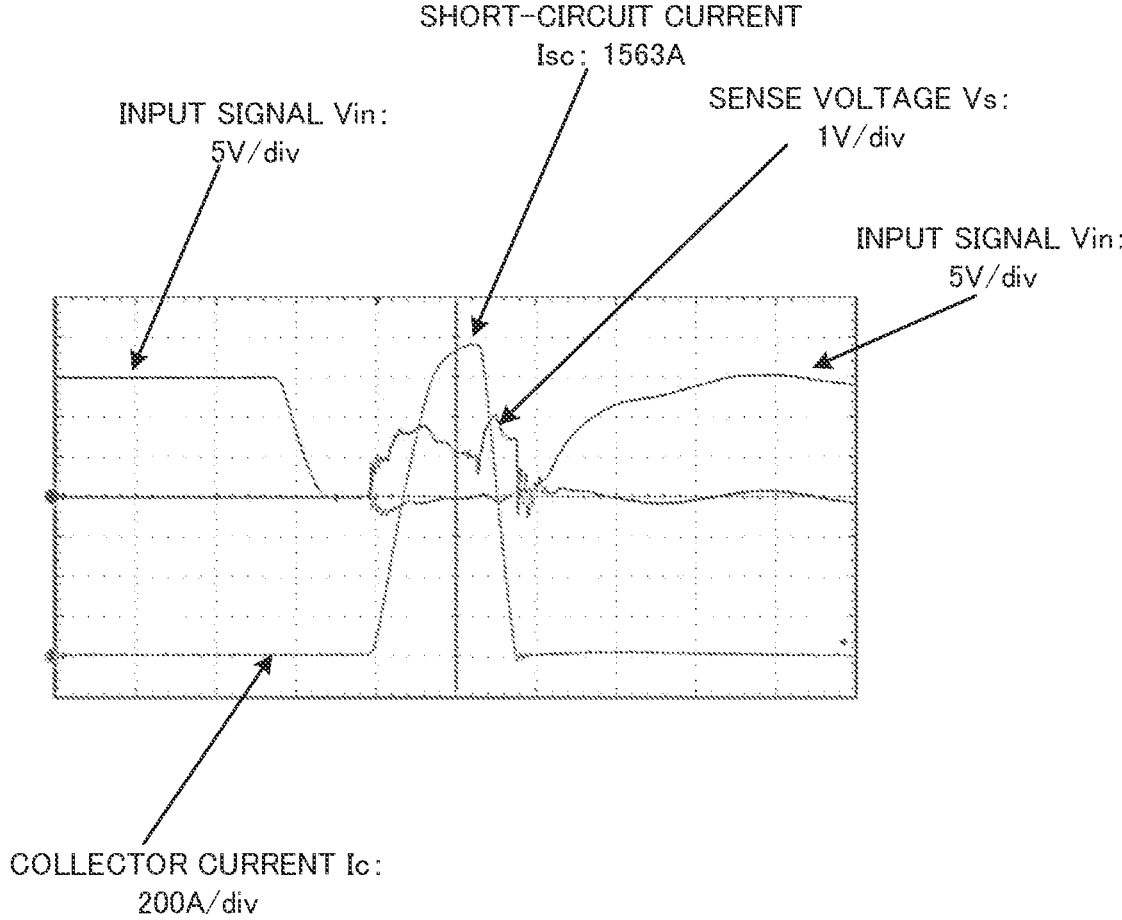
FIG. 5 illustrates an example of a short-circuit waveform of the IGBT.

Each of FIGS. 4 and 5 illustrates an example of a short-circuit waveform of the IGBT. In each of FIGS. 4 and 5, a horizontal axis indicates time (1 μs/div) and a vertical axis indicates voltage or current. In each of FIGS. 4 and 5, the input signal Vin (5V/div), the sense voltage Vs (1V/div), and the collector current Ic (200 A/div) are indicated.

FIG. 4 illustrates an arm short-circuit waveform of the IGBT 11 obtained when the driving current Ig is small. When the driving current Ig is small, a short-circuit current Isc is 1244 A. Furthermore, FIG. 5 illustrates an arm short-circuit waveform of the IGBT 11 obtained when the driving current Ig is large. When the driving current Ig is large, the short-circuit current Isc is 1563 A. Each arm short-circuit waveform is the same as the waveform of the collector current Ic.

It is assumed that a short circuit occurs when the driving current Ig is small, then the semiconductor device resumes output and a short circuit occurs again. When the semiconductor device does not have a latch release condition, the gate may be charged with a large driving current Ig. Accordingly, as illustrated in FIG. 5, a short-circuit current value may increase.

Figure 6:
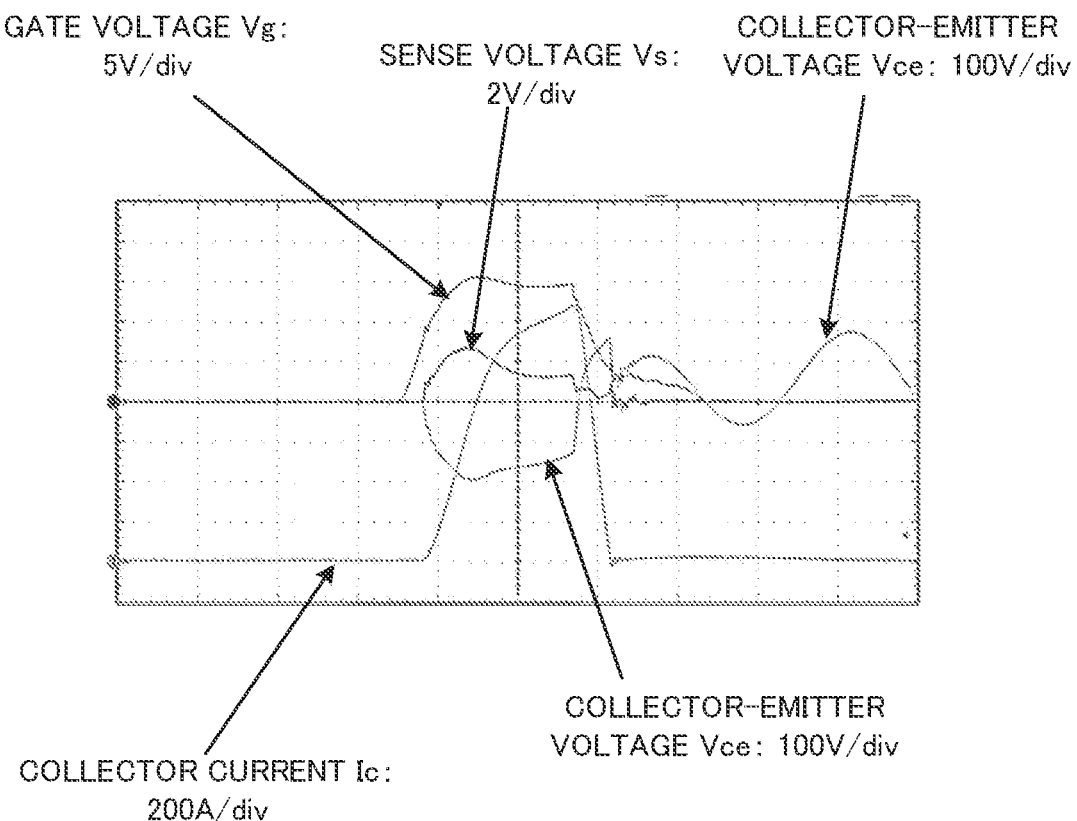
FIG. 6 illustrates an example of a short-circuit waveform of the IGBT.
Figure 7:
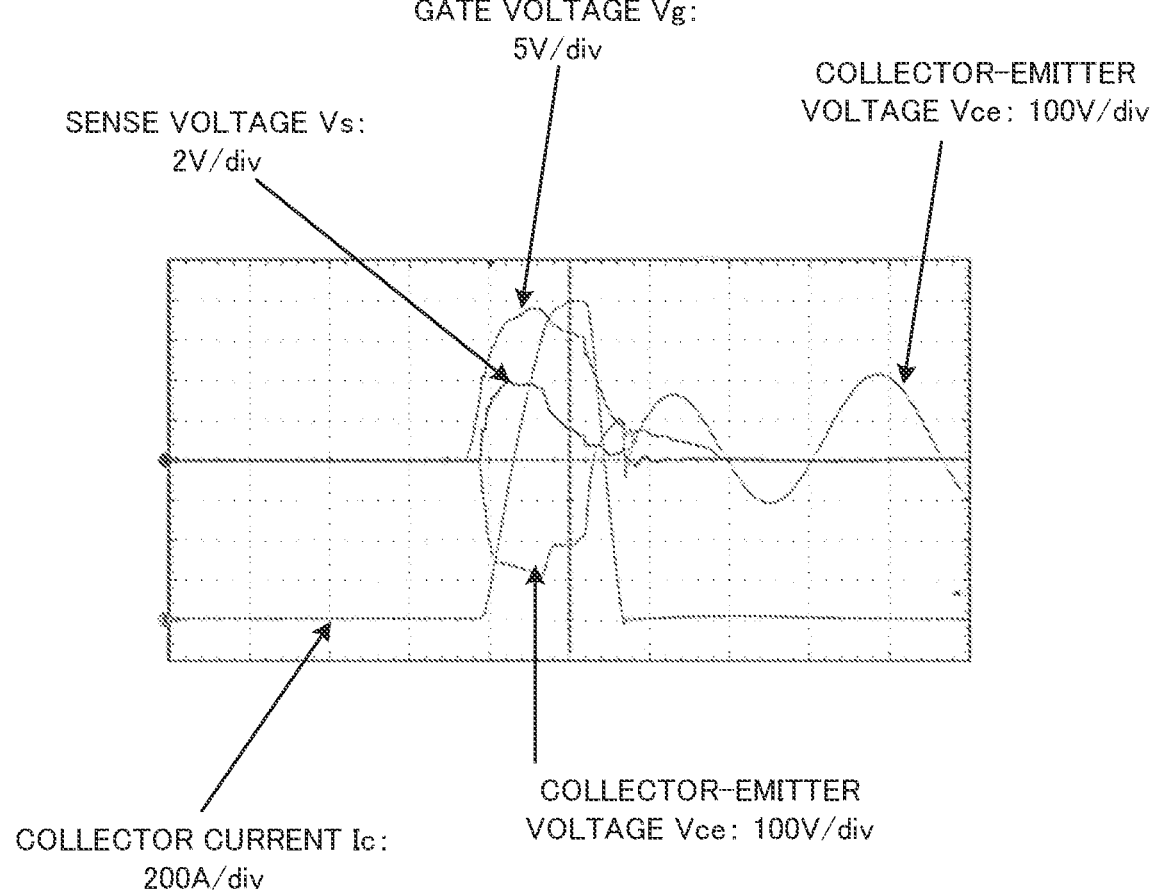
FIG. 7 illustrates an example of a short-circuit waveform of the IGBT.

Each of FIGS. 6 and 7 illustrates an example of a short-circuit waveform of the IGBT. In each of FIGS. 6 and 7, a horizontal axis indicates time (1 μs/div) and a vertical axis indicates voltage or current. In each of FIGS. 6 and 7, the gate voltage Vg (5V/div), the sense voltage Vs (2V/div), and the collector current Ic (200 A/div) are indicated. In FIGS. 6 and 7, the input signal Vin indicated in FIGS. 4 and 5 is changed to the gate voltage Vg.

FIG. 6 illustrates an arm short-circuit waveform of the IGBT 11 obtained when the driving current Ig is small. FIG. 7 illustrates an arm short-circuit waveform of the IGBT 11 obtained when the driving current Ig is large (each arm short-circuit waveform is the same as the waveform of the collector current Ic).

When the driving current Ig is large, di/dt of the collector current Ic is large. As a result, L×di/dt, which is the product of wiring inductance L and di/dt, is large and a short-circuit current is large (there is a proportional relationship between the gate voltage Vg and the short-circuit current Isc).

Furthermore, when the driving current Ig is large, the gate voltage Vg steeply rises. In the examples of FIGS. 6 and 7, the gate voltage Vg generated when the driving current Ig is large rises more steeply than the gate voltage Vg generated when the driving current Ig is small rises. The gate voltage Vg generated when the driving current Ig is large increases by about 4 V. Electromotive force determined by the magnitude of L×di/dt is superimposed in this way on the gate voltage Vg. As a result, a short-circuit current increases.

<Structure of Semiconductor Device>

Figure 8:
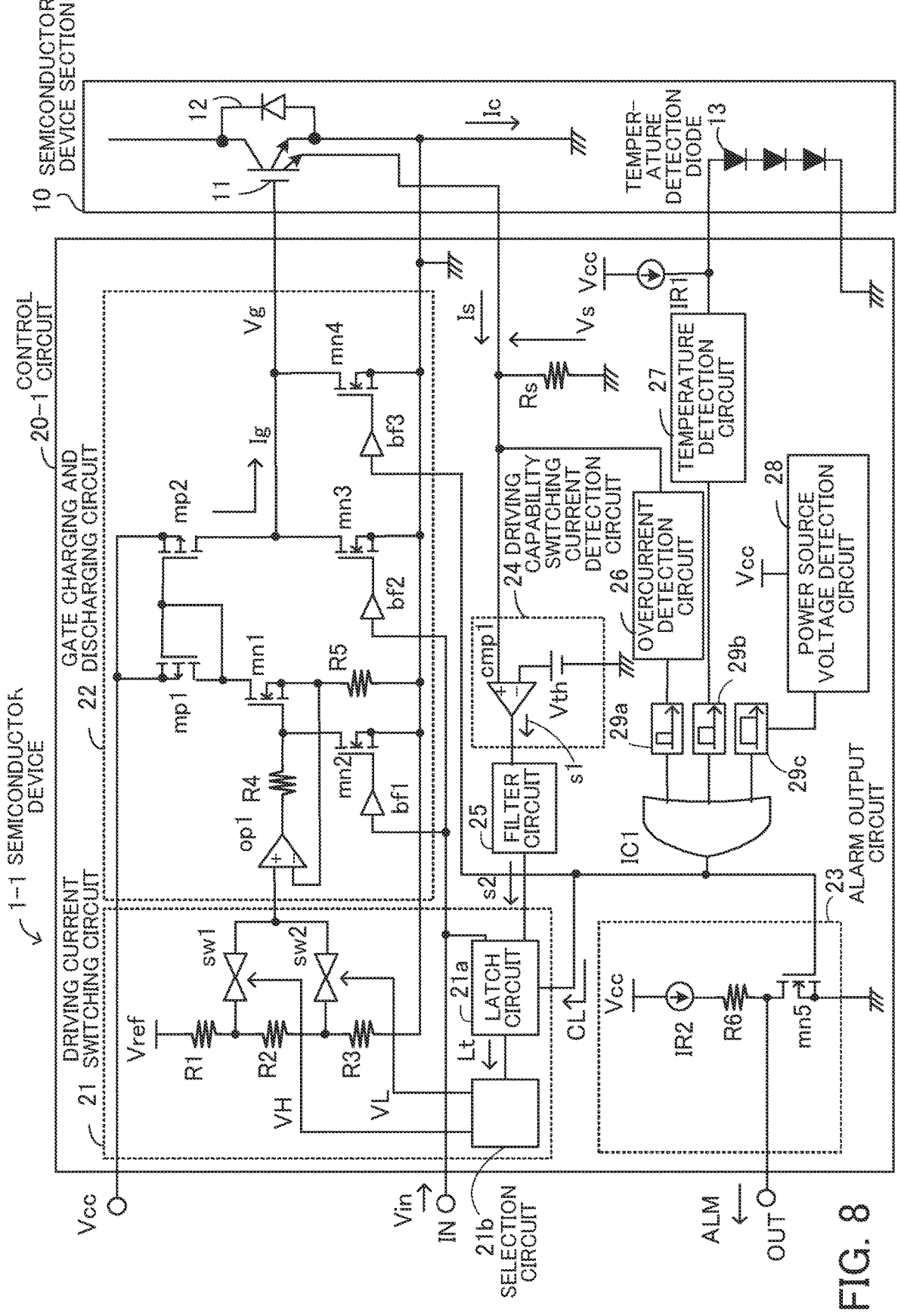
FIG. 8 illustrates an example of the structure of a semiconductor device.

A semiconductor device according to an embodiment having a latch release condition will now be described. FIG. 8 illustrates an example of the structure of a semiconductor device. A semiconductor device 1-1 includes a semiconductor device section 10 and a control circuit 20-1. In the control circuit 20-1, an output end of a logical OR element IC1 is connected to an input end of a buffer bf3, a gate of an NMOS transistor mn5, and a clear terminal of a latch circuit 21*a*.

With the semiconductor device 1-1, an H-level alarm signal output from the logical OR element IC1 is input as a clear signal CL (release signal) to the clear terminal of the latch circuit 21*a* as the latch release condition. The structure of the semiconductor device 1-1 differs from the semiconductor device 2 illustrated in FIG. 2 only in this respect.

<Filter Circuit>

Figure 9:
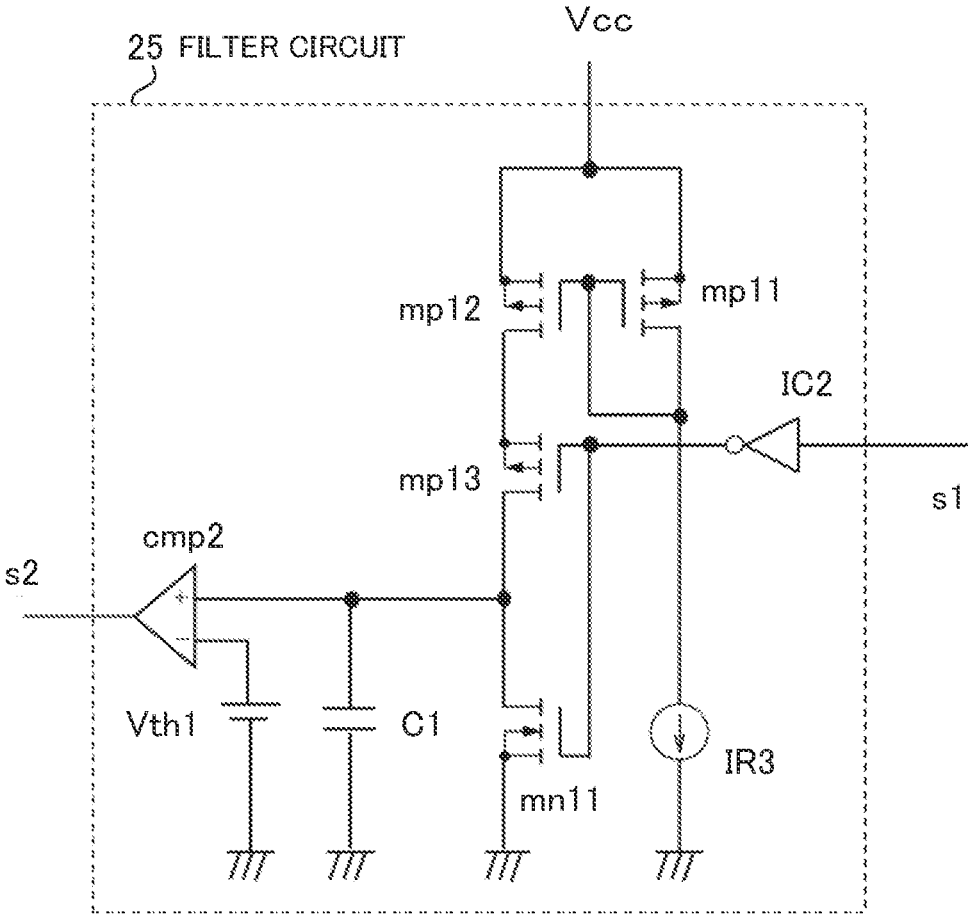
FIG. 9 illustrates an example of the structure of a filter circuit.

FIG. 9 illustrates an example of the structure of the filter circuit. The filter circuit 25 waveform-shapes a switching signal s1 output from the driving capability switching current detection circuit 24 (for example, the filter circuit 25 waveform-shapes the switching signal s1 so as to delay its rising for a determined time).

The filter circuit 25 includes PMOS transistors mp11 and mp12 which are connected to the power source voltage Vcc and which make up a current mirror circuit and a constant-current source IR3 interposed between a drain of the PMOS transistor mp11 and the GND. Furthermore, a PMOS transistor mp13 and an NMOS transistor mn11 connected in series are interposed between a drain of the PMOS transistor mp12 and the GND.

A connection point of the PMOS transistor mp13 and the NMOS transistor mn11 is connected to a non-inverting input terminal (+) of a comparator cmp2 and one end of a capacitor C1. One end of a reference power source which outputs a reference voltage Vth1 is connected to an inverting input terminal (−) of the comparator cmp2. The other end of the capacitor C1 and the other end of the reference power source are connected to the GND. An input end of a NOT element IC2 corresponds to an input end of the filter circuit 25 and the switching signal s1 is input thereto.

An output end of the NOT element IC2 is connected to gates of the PMOS transistor mp13 and the NMOS transistor mn11. An output end of the comparator cmp2 corresponds to an output end of the filter circuit 25 and is connected to an input end of the latch circuit 21*a*. A filter signal s2 is output from the output end of the filter circuit 25.

The filter circuit 25 has the above structure. When the switching signal s1 input to the filter circuit 25 changes from L level to H level, an output of the NOT element IC2 becomes L level. As a result, the NMOS transistor mn11 turns off, the PMOS transistor mp13 turns on, and the capacitor C1 is charged with a constant current prescribed by the constant-current source IR3. Furthermore, when a charging voltage of the capacitor C1 exceeds the reference voltage Vth1, an output of the comparator cmp2 becomes H level.

In addition, when the switching signal s1 input to the filter circuit 25 becomes L level, an output of the NOT element IC2 becomes H level. As a result, the NMOS transistor mn11 turns on, the PMOS transistor mp13 turns off, and electric charges charged in the capacitor C1 are discharged. Accordingly, a voltage at the non-inverting input terminal (+) of the comparator cmp2 becomes lower than or equal to the reference voltage Vth1 and an output of the comparator cmp2 becomes L level.

That is to say, only when the switching signal s1 becomes H level, the filter circuit 25 delays the switching signal s1 for a certain time and outputs it. A delay time is adjusted by a value of a constant current output from the constant-current source IR3, mirror ratio of the current mirror circuit, charging time of the capacitor C1 depending on a capacitance value of the capacitor C1, and the reference voltage Vth1.

<Latch Circuit>

Figure 10:
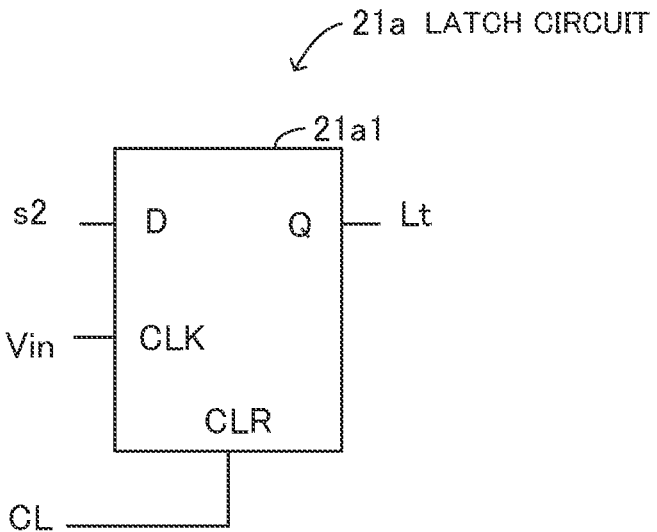
FIG. 10 illustrates an example of the structure of a latch circuit.

FIG. 10 illustrates an example of the structure of the latch circuit. The latch circuit 21*a* may be a D flip-flop 21*a*1. A D terminal (data input end) of the D flip-flop 21*a*1 is connected to the output end of the filter circuit 25 and the filter signal s2 is input. An input signal Vin is input to a clock terminal. Furthermore, a Q terminal (output end) of the D flip-flop 21*a*1 is connected to an input end of the selection circuit 21*b*. A latch signal Lt is output from the Q terminal. In addition, a clear signal CL is input to a clear terminal CLR of the D flip-flop 21*a*1.

The latch circuit 21*a* has the above structure. The latch circuit 21*a* latches the filter signal s2 (at L or H level) output from the filter circuit 25 at the rising of the input signal Vin and outputs a state of the filter signal s2 to the Q terminal. An output state of the Q terminal is kept until the next rising timing of the input signal Vin. Furthermore, when an H-level clear signal CL is input, a latch state is releases. At this time, an L-level signal is output from the Q terminal.

<Selection Circuit>

Figure 11:
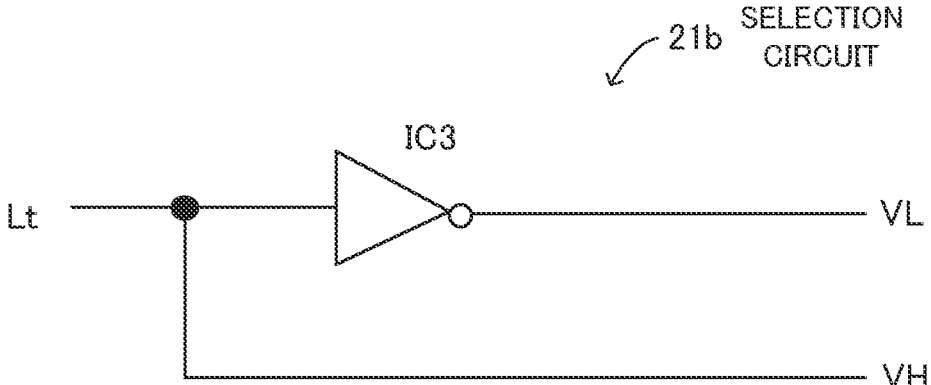
FIG. 11 illustrates an example of the structure of a selection circuit.

FIG. 11 illustrates an example of the structure of the selection circuit. The selection circuit 21*b* includes a NOT element IC3. The selection circuit 21*b* outputs selection signals VH and VL generated on the basis of an output signal from the latch circuit 21*a* to the switches sw1 and sw2.

An input end of the NOT element IC3 is connected to an output end of the latch circuit 21*a* and the latch signal Lt is input to the input end of the NOT element IC3. An output end of the NOT element IC3 corresponds to an output end of the selection circuit 21*b* and the selection signal VL is output from the output end of the selection circuit 21*b*. Furthermore, the input end of the NOT element IC3 also corresponds to a second output end of the selection circuit 21*b* and the selection signal VH is output from this output end of the selection circuit 21*b*.

When a collector current Ic of the IGBT 11 is small, a sense voltage Vs generated on the basis of a sense current Is is lower than a threshold voltage Vth and the switching signal s1 output is at L level (first switching signal). As a result, an output of the latch circuit 21*a* (latch signal Lt)

latched at the rising of the input signal Vin is at L level. Accordingly, an input of the NOT element IC3 is at L level and an output of the NOT element IC3 is at H level. As a result, the selection signal VL output from the selection circuit 21*b* is at H level (first selection signal) and the selection signal VH output from the selection circuit 21*b* is at L level (first selection signal).

Furthermore, when the collector current Ic of the IGBT 11 is large, the sense voltage Vs generated on the basis of the sense current Is is higher than or equal to the threshold voltage Vth and the switching signal s1 output is at H level (second switching signal). As a result, the output of the latch circuit 21*a* latched at the rising of the input signal Vin is at H level. Accordingly, the input of the NOT element IC3 is at H level and the output of the NOT element IC3 is at L level. As a result, the selection signal VL output from the selection circuit 21*b* is at L level (second selection signal) and the selection signal VH output from the selection circuit 21*b* is at H level (second selection signal).

In addition, when a latch state of the latch circuit 21*a* is released by the clear signal CL, an output of the latch circuit 21*a* becomes L level. Accordingly, the input of the NOT element IC3 is at L level and the output of the NOT element IC3 is at H level. As a result, the selection signal VL output from the selection circuit 21*b* is at H level and the selection signal VH output from the selection circuit 21*b* is at L level.

<Driving Current Control Operation>

Resistors R1, R2, and R3 included in the driving current switching circuit 21 of the semiconductor device 1-1 make up a resistor voltage division circuit. One end (resister R1 side) of the resistor voltage division circuit is connected to the voltage Vref and the other end (resister R3 side) of the resistor voltage division circuit is connected to the GND.

For example, each of the switches sw1 and sw2 may be a CMOS switch (transfer gate) formed by connecting an NMOS transistor and a PMOS transistor in parallel. When a gate signal is at H level, each of the switches sw1 and sw2 goes into on state.

The switches sw1 and sw2 selectively turn on according to an output from the selection circuit 21*b*. Specifically, the selection signal VH is input to a gate (switch control terminal) of the switch sw1. When a signal output from the comparator cmp1 is at H level, the switch sw1 turns on. The selection signal VL is input to a gate of the switch sw2. When the signal output from the comparator cmp1 is at L level, the switch sw2 turns on.

Furthermore, when the switch sw1 turns on, a relatively high voltage is applied to the non-inverting input terminal (+) of the operational amplifier op1 by the resistor voltage division circuit made up of the resistors R1, R2, and R3. When the switch sw2 turns on, a relatively low voltage is applied to the non-inverting input terminal (+) of the operational amplifier op1 by the resistor voltage division circuit made up of the resistors R1, R2, and R3.

These cases correspond to a case where the collector current Ic of the IGBT 11 is large and a case where the collector current Ic of the IGBT 11 is small, respectively. In addition, a case where a relatively low voltage is applied to the non-inverting input terminal (+) of the operational amplifier op1 corresponds to a latch release state of the latch circuit 21*a*. A resistance value of each of the resistors R1, R2, and R3 is properly set so as to obtain a desired resistor voltage division effect. The gate charging and discharging circuit 22 supplies a current obtained by applying a voltage output from the operational amplifier op1 to the resistor R5 to the gate of the IGBT 11.

<Time Chart of Operation of Semiconductor Device>

Figure 12:
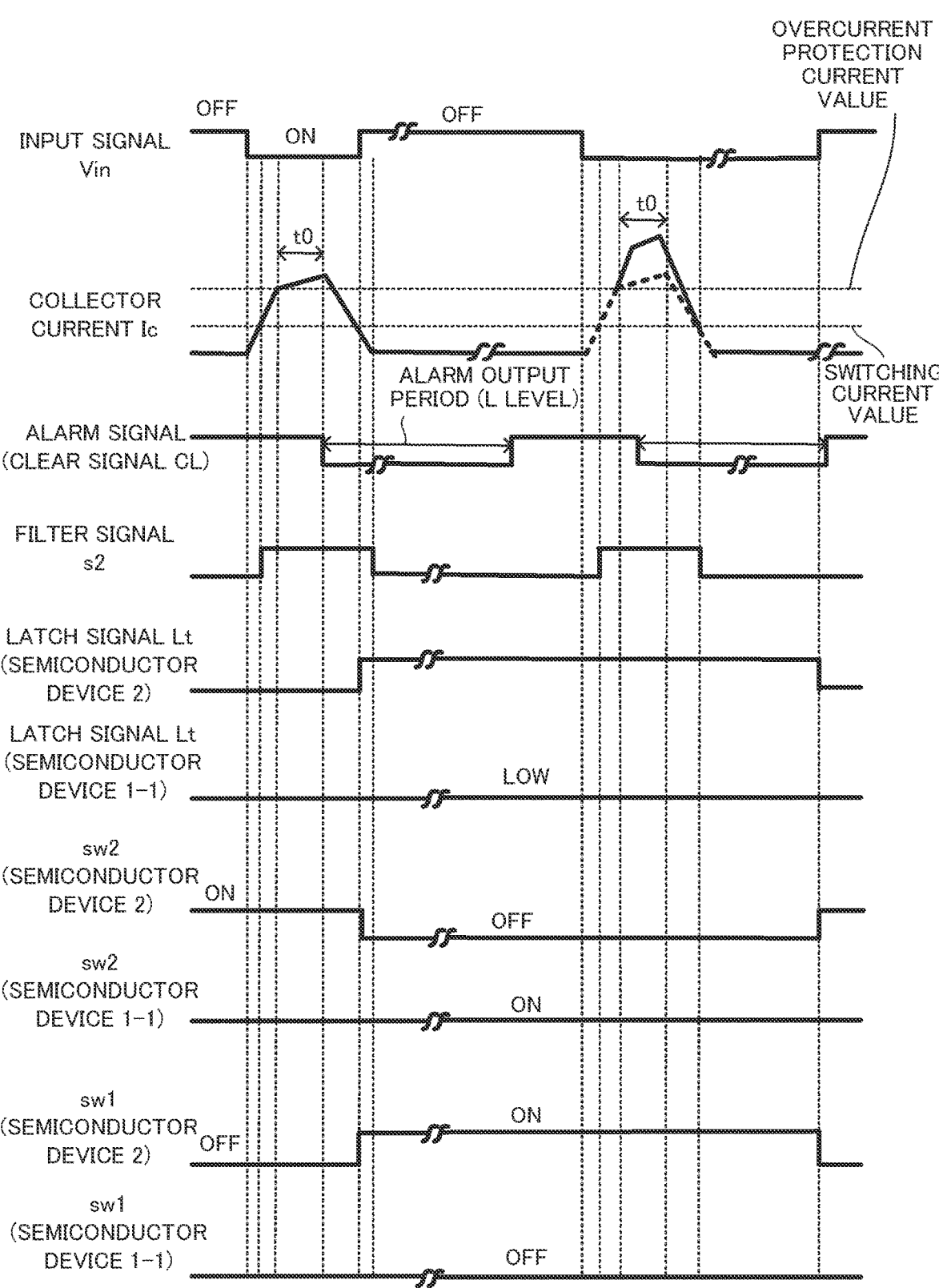
FIG. 12 is a time chart illustrative of an example of the operation of the semiconductor device.

FIG. 12 is a time chart illustrative of an example of the operation of the semiconductor device. When the input signal Vin is at L level (on), the IGBT 11 is turned on. When the IGBT 11 is turned on, the collector current Ic flows through the IGBT 11 and increases. The collector current Ic decreases after the elapse of cut-off delay time to. A solid line waveform indicates the collector current Ic of the semiconductor device 2 and a dotted line waveform indicates the collector current Ic of the semiconductor device 1-1.

When the collector current Ic exceeds an overcurrent protection current value, an L-level alarm signal is output for an alarm output period. Furthermore, the filter circuit 25 outputs the filter signal s2 obtained by filtering the switching signal s1 output from the driving capability switching current detection circuit 24.

A level of the latch signal Lt and turn on/off of the switches sw1 and sw2 will now be described separately for the semiconductor device 2 that does not have a latch release condition and the semiconductor device 1-1 that has the latch release condition.

With the semiconductor device 2, a latch state of the latch circuit 21a is not released when the semiconductor device 2 is in an alarm state. Accordingly, the latch circuit 21a continues to latch an H-level filter signal s2 and continues to output an H-level latch signal Lt (in the example of FIG. 12, the latch circuit 21a continues to output an H-level latch signal Lt until the next on-state of the IGBT 11 ends). As a result, the H-level latch signal Lt is input to the selection circuit 21b. Accordingly, the selection signal VH is at H level and the selection signal VL is at L level.

In this case, the switch sw1 turns on by the H-level selection signal VH and the switch sw2 turns off by the L-level selection signal VL. As a result, a large driving current Ig is input to the gate of the IGBT 11.

Therefore, if the semiconductor device 2 stops at the time of the occurrence of an alarm and then restarts and a short circuit occurs again, the gate of the IGBT 11 is charged with a large driving current Ig. As a result, the collector current Ic increases (collector current Ic indicated by the solid line waveform).

With the semiconductor device 1-1, on the other hand, when the semiconductor device 1-1 goes into an alarm state, the clear signal CL (which is the same as the alarm signal) is input to the latch circuit 21a and a latch state is released.

Because a latch state is released by the clear signal CL, the latch circuit 21a outputs an L-level latch signal Lt (latch release output signal). As a result, the L-level latch signal Lt is input to the selection circuit 21b. Accordingly, the selection signal VH is at L level and the selection signal VL is at H level.

In this case, the switch sw1 turns off by the L-level selection signal VH and the switch sw2 turns on by the H-level selection signal VL. As a result, a small driving current Ig is input to the gate of the IGBT 11.

Therefore, if the semiconductor device 1-1 stops at the time of the occurrence of an alarm and then restarts and a short circuit occurs again, the gate of the IGBT 11 is charged with a small driving current Ig. As a result, an increase in the collector current Ic is suppressed (collector current Ic indicated by the dotted line waveform).

As stated above, with the semiconductor device 1-1, a latch state of the latch circuit 21a is released at the time of the occurrence of an alarm. When the first instructions to turn on are given by the input signal Vin after the semiconductor device 1-1 resumes operation, the gate of the IGBT 11 is charged with a small driving current Ig. As a result, when a short circuit occurs again, a short-circuit current is suppressed. Furthermore, noise at normal operation time is suppressed.

<Switching Current Value>

Figure 13:
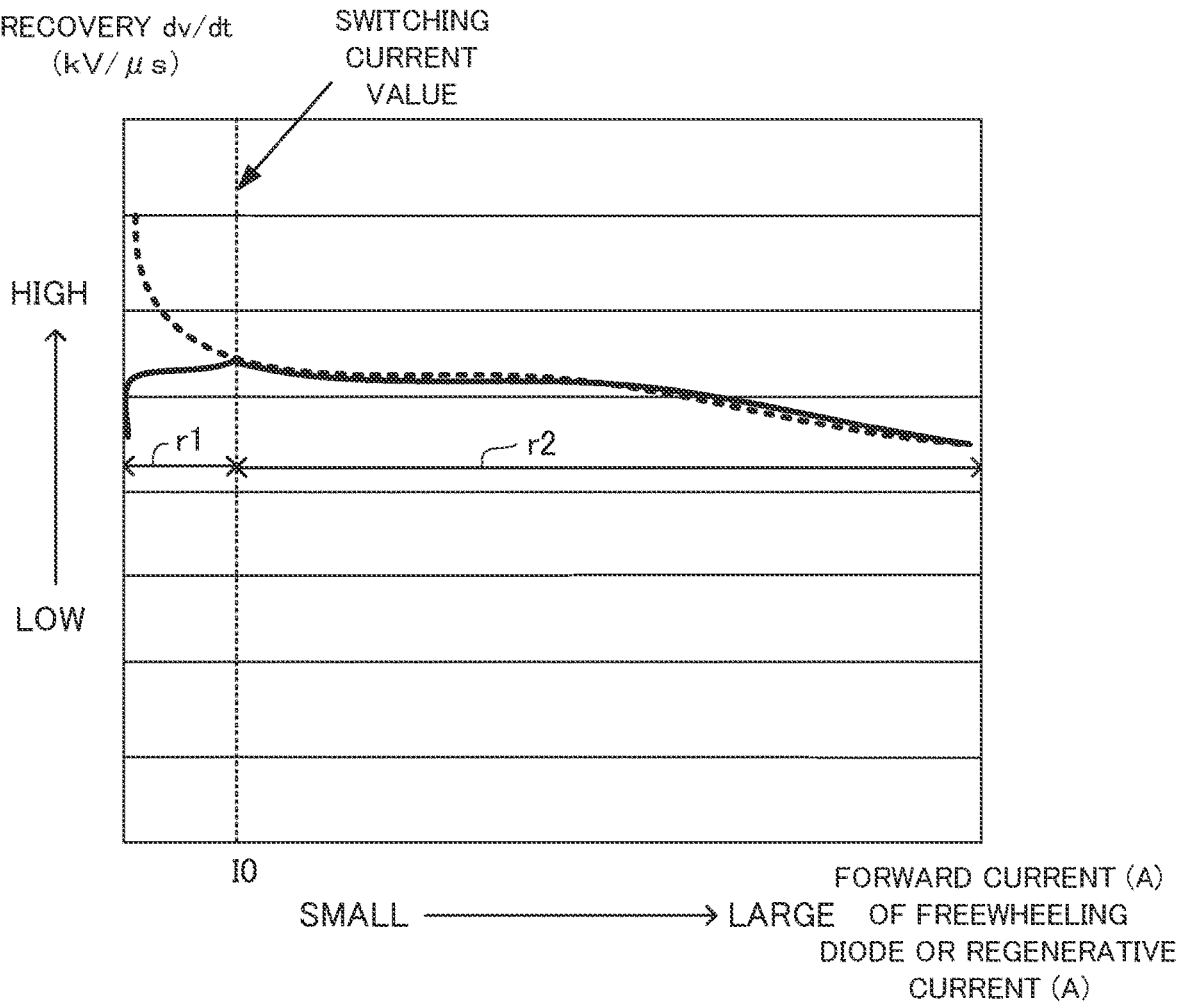
FIG. 13 is a view for describing a switching current value.

FIG. 13 is a view for describing a switching current value. In FIG. 13, a horizontal axis indicates forward current (A) of a freewheeling diode or regenerative current (A) and a vertical axis indicates recovery dv/dt (kV/μs). When the IGBT 11 turns on, a diode of an opposite arm performs recovery operation. Recovery dv/dt indicates a voltage change rate at that time. Furthermore, in FIG. 13, a dotted line waveform indicates dv/dt when recovery obtained a semiconductor device does not have a driving current control function and a solid line waveform indicates recovery dv/dt obtained when a semiconductor device has a driving current control function on the basis of the magnitude of a collector current Ic.

There is a tendency for recovery dv/dt to have a maximum value not in a large current region r2 (second current region) of a collector current Ic but in a small current region r1 (first current region). Accordingly, with the semiconductor device 1-1, the driving current Ig is small in the small current region r1 in which the collector current Ic is smaller than a switching current value 10 and the driving current Ig is large in the large current region r2 in which the collector current Ic is larger than or equal to the switching current value 10. This makes it possible to decrease noise while suppressing an increase in loss. As a result, the trade-off relationship between noise and switching loss is optimized.

<Modifications of Semiconductor Device>

Figure 14:
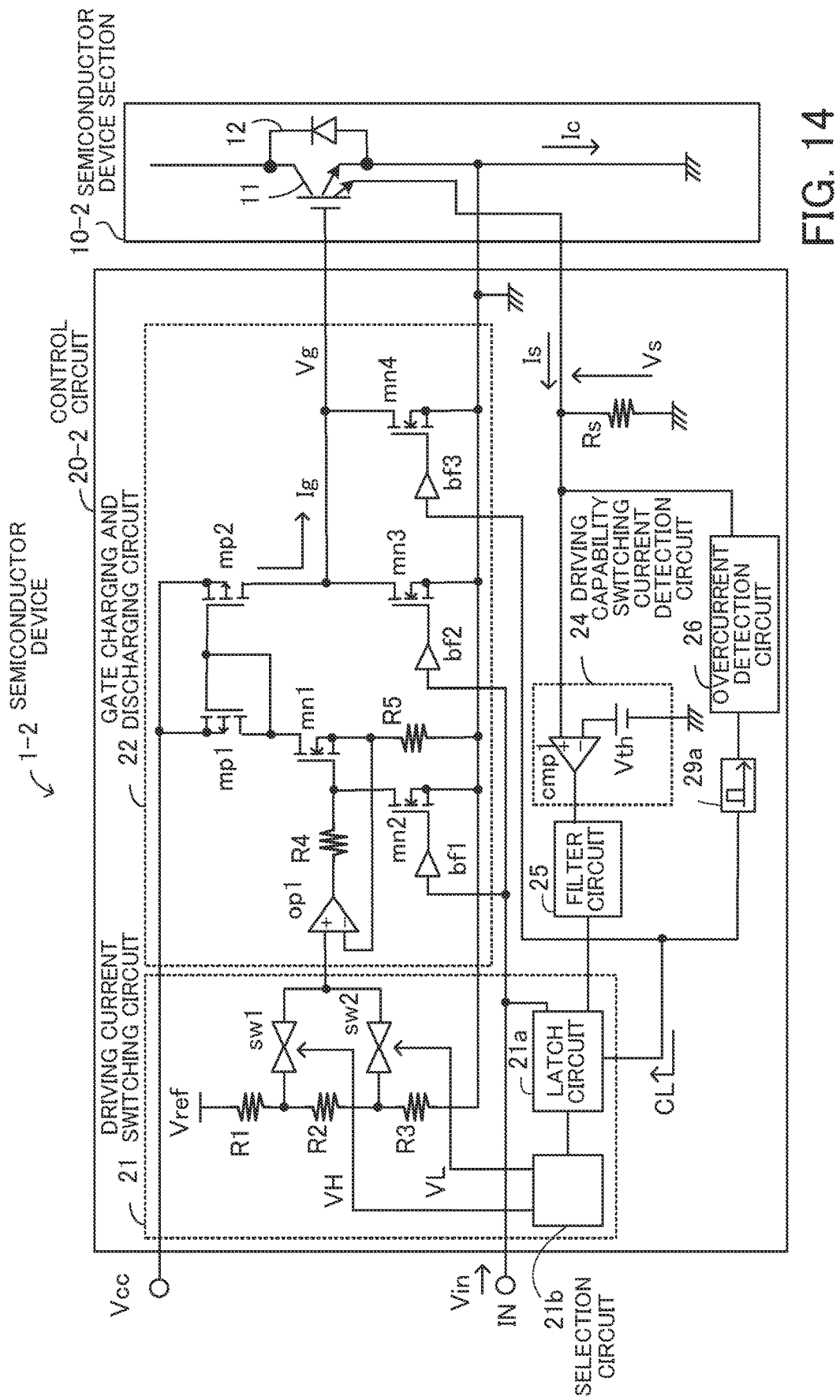
FIG. 14 illustrates a modification of the semiconductor device.

FIG. 14 illustrates a modification of the semiconductor device. A semiconductor device 1-2 does not have an alarm function and includes a semiconductor device section 10-2 and a control circuit 20-2. The semiconductor device section 10-2 includes an IGBT 11 and a diode 12. The control circuit 20-2 includes a driving current switching circuit 21, a gate charging and discharging circuit 22, a driving capability switching current detection circuit 24, a filter circuit 25, an overcurrent detection circuit 26, a one-shot circuit 29a, and a sense resistor Rs.

An output end of the overcurrent detection circuit 26 is connected to an input end of the one-shot circuit 29a and an output end of the one-shot circuit 29a is connected to an input end of a buffer bf3 and a clear terminal of a latch circuit 21a.

Accordingly, with the semiconductor device 1-2, an overcurrent detection signal output via the one-shot circuit 29a from the overcurrent detection circuit 26 is input as a clear signal CL to the clear terminal of the latch circuit 21a as a latch release condition.

As stated above, with the semiconductor device 1-2, a latch signal Lt output from the latch circuit 21a is set to L level not by an alarm signal but by the overcurrent detection circuit 26. That is to say, when the overcurrent detection circuit 26 detects an overcurrent and outputs an H-level overcurrent detection signal, an output of the latch circuit 21a becomes L level. Accordingly, even with the semiconductor device 1-2 that does not have an alarm signal output function, a latch is released.

Figure 15:
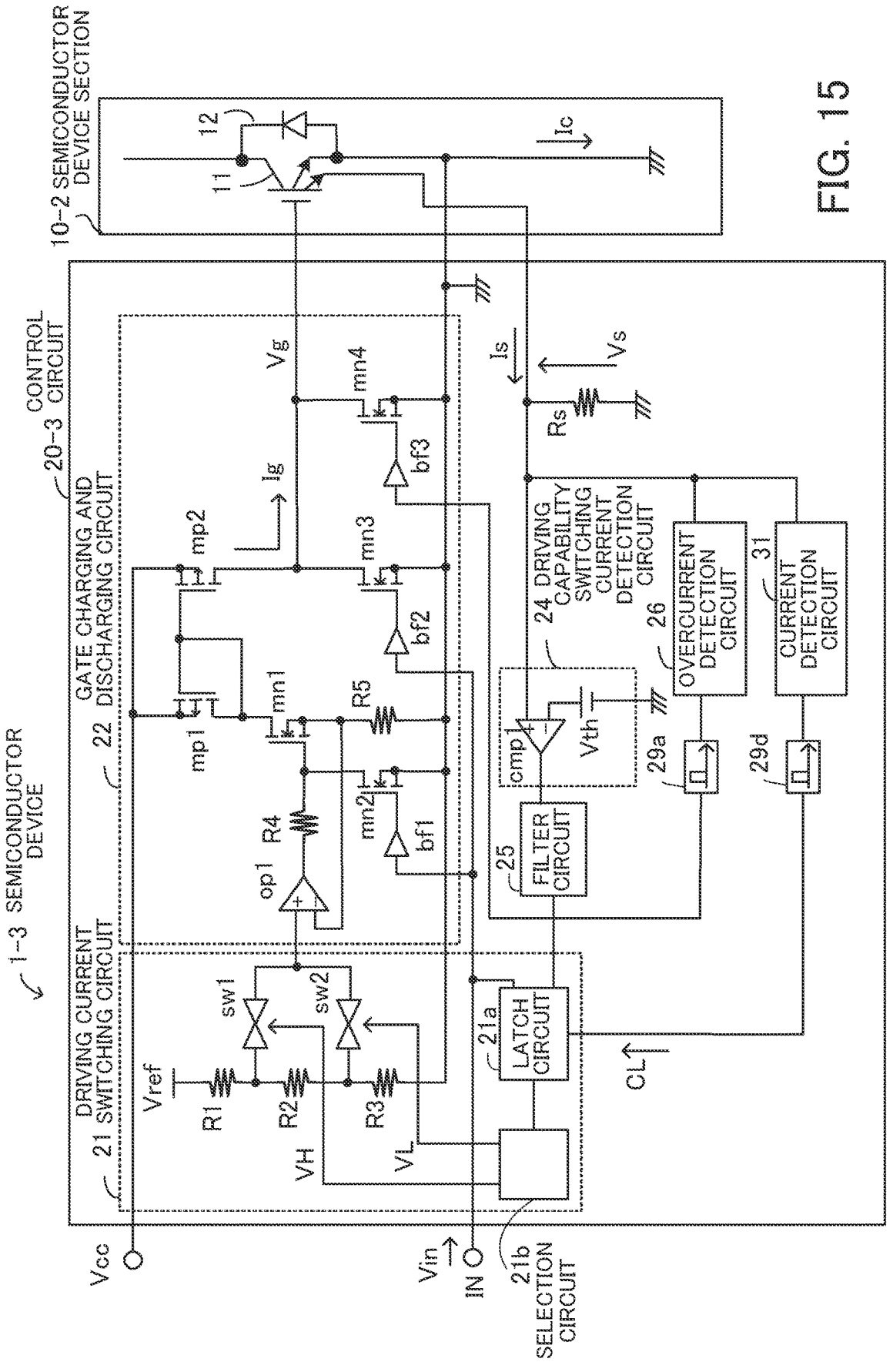
FIG. 15 illustrates a modification of the semiconductor device.

FIG. 15 illustrates a modification of the semiconductor device. A semiconductor device 1-3 does not have an alarm function and includes a semiconductor device section 10-2 and a control circuit 20-3. The control circuit 20-3 includes a driving current switching circuit 21, a gate charging and discharging circuit 22, a driving capability switching current detection circuit 24, a filter circuit 25, an overcurrent detection circuit 26, a current detection circuit 31, one-shot circuits 29a and 29d, and a sense resistor Rs.

An input end of the current detection circuit 31 is connected to a sense emitter of an IGBT 11, one end of the sense resistor Rs, an input end of the driving capability switching current detection circuit 24, and an input end of the over-current detection circuit 26. An output end of the current detection circuit 31 is connected to an input end of the one-shot circuit 29d and an output end of the one-shot circuit 29d is connected to a clear terminal of a latch circuit 21a.

When the current detection circuit 31 detects that a determined collector current Ic flows, the current detection circuit 31 outputs an H-level current detection signal. Setting is performed so that a current detection threshold voltage of the current detection circuit 31 will be higher an overcurrent detection threshold voltage of the than overcurrent detection circuit 26 and so that cut-off delay time (dead time) will be short.

With the semiconductor device 1-3, a current detection signal output via the one-shot circuit 29d from the current detection circuit 31 is input as a clear signal CL to the clear terminal of the latch circuit 21a as a latch release condition.

As stated above, with the semiconductor device 1-3, a latch signal Lt output from the latch circuit 21a is set to L level by the current detection circuit 31 other than the overcurrent detection circuit 26. That is to say, when the current detection circuit 31 detects that the collector current Ic reaches a determined value and outputs an H-level current detection signal, an output of the latch circuit 21a becomes L level. Accordingly, even with the semiconductor device 1-3 that does not have an alarm signal output function, a latch is released.

Figure 16:
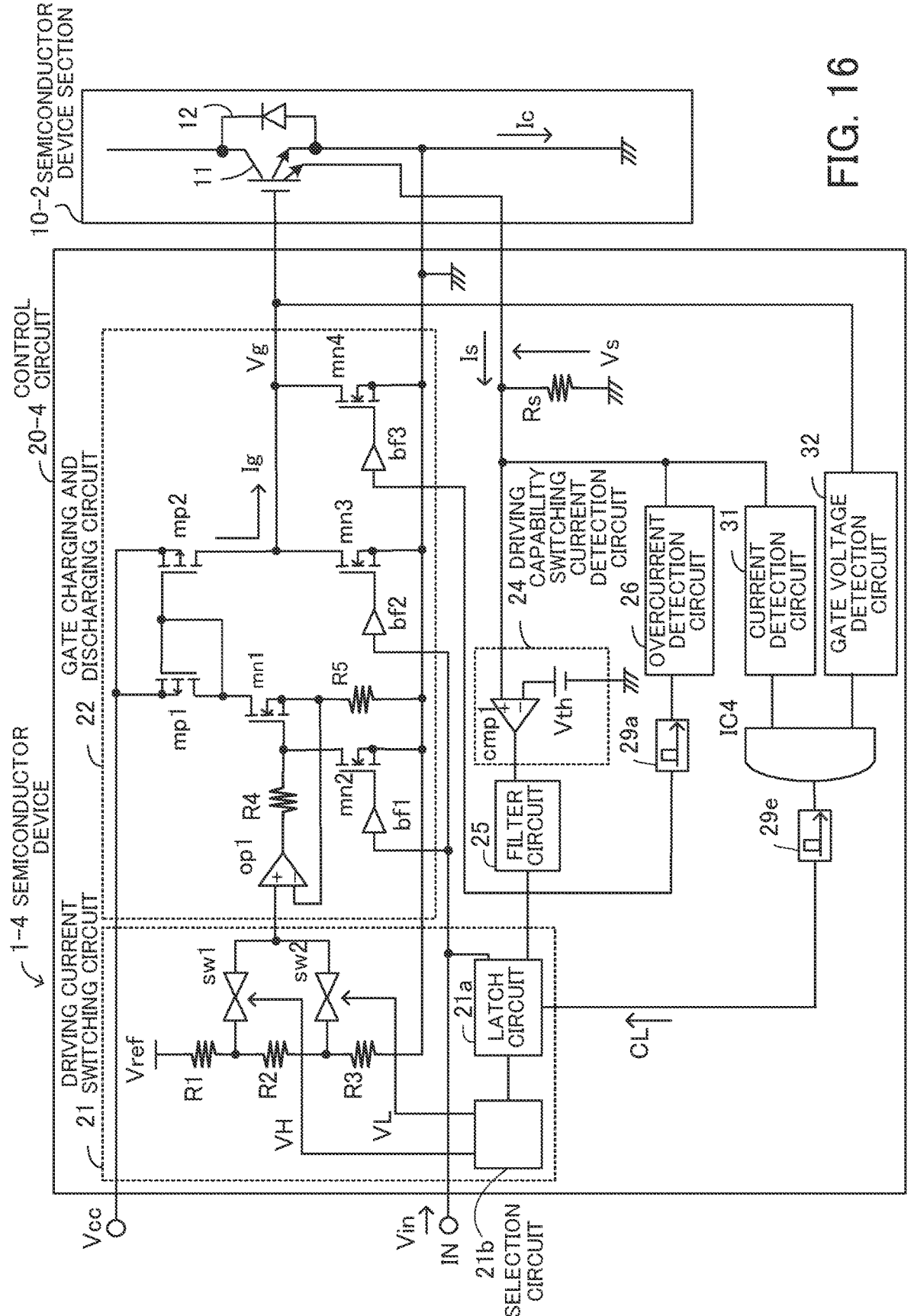
FIG. 16 illustrates a modification of the semiconductor device.

FIG. 16 illustrates a modification of the semiconductor device. A semiconductor device 1-4 does not have an alarm function and includes a semiconductor device section 10-2 and a control circuit 20-4. The control circuit 20-4 includes a driving current switching circuit 21, a gate charging and discharging circuit 22, a driving capability switching current detection circuit 24, a filter circuit 25, an overcurrent detection circuit 26, a current detection circuit 31, a gate voltage detection circuit 32, one-shot circuits 29a and 29e, an AND element IC4 with two inputs and one output, and a sense resistor Rs.

An input end of the current detection circuit 31 is connected to a sense emitter of an IGBT 11, one end of the sense resistor Rs, an input end of the driving capability switching current detection circuit 24, and an input end of the over-current detection circuit 26. An input end of the gate voltage detection circuit 32 is connected to a gate of the IGBT 11, a drain of a PMOS transistor mp2, a drain of an NMOS transistor mn3, and a drain of an NMOS transistor mn4.

An output end of the current detection circuit 31 is connected to one input end of the AND element IC4 and an output end of the gate voltage detection circuit 32 is connected to the other input end of the AND element IC4. An output end of the AND element IC4 is connected to an input end of the one-shot circuit 29e and an output end of the one-shot circuit 29e is connected to a clear terminal of a latch circuit 21a.

When the current detection circuit 31 detects that a determined collector current Ic flows through the IGBT 11, the current detection circuit 31 outputs an H-level current detection signal. When the gate voltage detection circuit 32 detects that a gate voltage Vg of the IGBT 11 is higher than or equal to a determined voltage, the gate voltage detection circuit 32 outputs an H-level gate voltage detection signal. The AND element IC4 executes the logical product of the H-level current detection signal and the H-level gate voltage detection signal and outputs an H-level signal.

With the semiconductor device 1-4, when the collector current Ic flowing through the IGBT 11 is larger than or equal to a determined current value and the gate voltage Vg of the IGBT 11 is higher than or equal to the determined voltage, an H-level detection signal is output via the one-shot circuit 29e from the AND element IC4. This H-level detection signal is input as a clear signal CL to the clear terminal of the latch circuit 21a as a latch release condition.

As stated above, with the semiconductor device 1-4, a latch signal Lt output from the latch circuit 21a is set to L level by the current detection circuit 31 and the gate voltage detection circuit 32. That is to say, when the current detection circuit 31 detects that the collector current Ic reaches the determined value and the gate voltage detection circuit 32 detects that the gate voltage Vg reaches the determined voltage, an output of the latch circuit 21a becomes L level. Accordingly, even with the semiconductor device 1-4 that does not have an alarm signal output function, a latch is released.

Figure 17A:
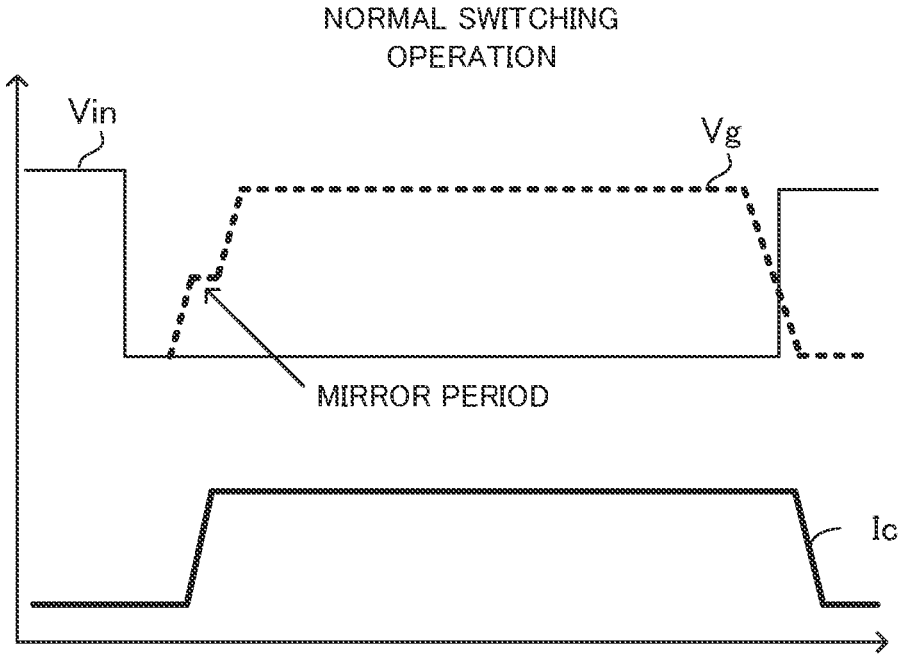
FIGS. 17A and 17B are schematic views of a switching waveform of an IGBT, FIG. 17A being a schematic view illustrative of a waveform of a normal switching operation, FIG. 17B being a schematic view illustrative of a waveform of a short-circuit operation.
Figure 17B:
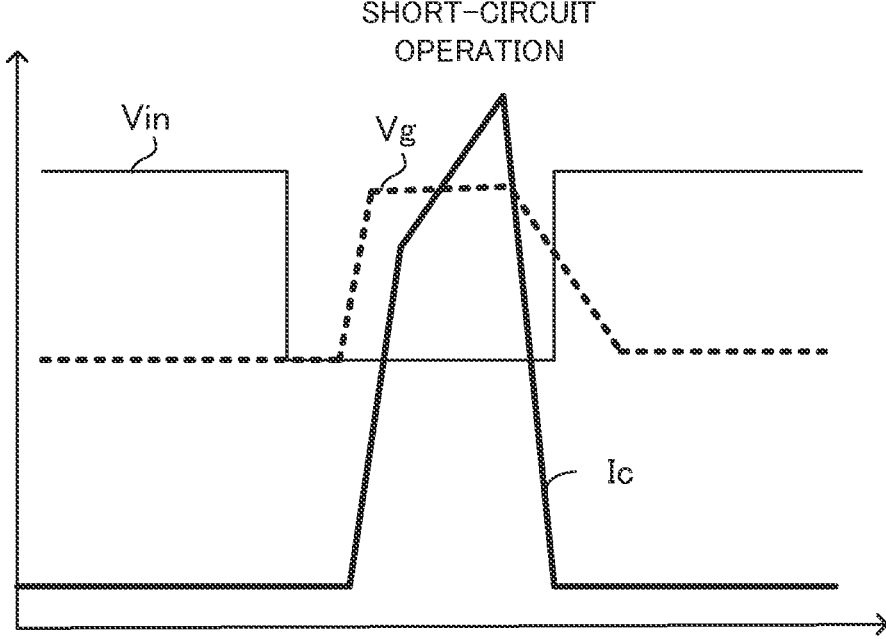

FIGS. 17A and 17B are schematic views of a switching waveform of an IGBT. FIG. 17A is a schematic view illustrative of a waveform of a normal switching operation. FIG. 17B is a schematic view illustrative of a waveform of a short-circuit operation. In each of FIGS. 17A and 17B, a horizontal axis indicates time and a vertical axis indicates voltage and current. As illustrated in FIGS. 17A and 17B, with the short-circuit operation, a gate voltage rises without the passing of a mirror period. Accordingly, a rising rate of a collector current to a gate voltage is high compared with the normal switching operation.

The semiconductor device 1-4 illustrated in FIG. 16 includes the current detection circuit 31 and the gate voltage detection circuit 32. When the current detection circuit 31 detects that the collector current Ic is larger than or equal to the determined current value and the gate voltage detection circuit 32 detects that the gate voltage Vg is higher than or equal to the determined voltage, there is a strong possibility that a short circuit has occurred in the IGBT 11. Accordingly, with the semiconductor device 1-4, it is possible to determine whether or not the IGBT 11 performs a short-circuit operation. When the determination that the IGBT 11 performs a short-circuit operation is made, a latch state of the latch circuit 21a is released.

<Example of Application of Semiconductor Device>

Figure 18:
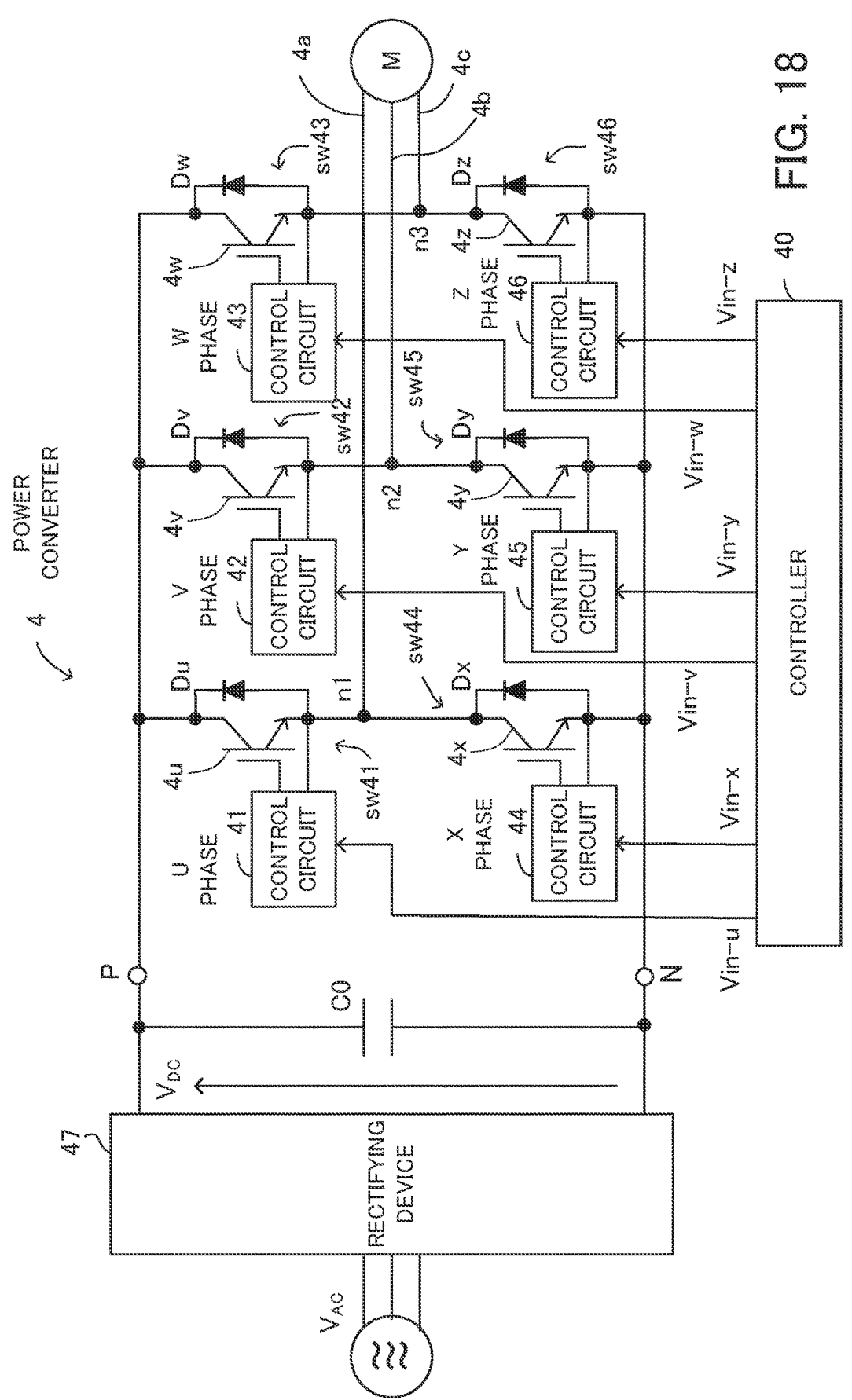
FIG. 18 illustrates an example of the structure of a power converter.

A power converter to which the semiconductor device according to the present disclosure is applied will now be described. FIG. 18 illustrates an example of the structure of a power converter. A power converter 4 includes switching elements sw41, sw42, and sw43 for a U phase, a V phase, and a W phase, respectively, located on an upper arm side and switching elements sw44, sw45, and sw46 for an X phase, a Y phase, and a Z phase, respectively, located on a lower arm side.

Furthermore, the power converter 4 includes an alternating-current power supply $V_{AC}$, a rectifying device 47, a smoothing capacitor C0, a controller 40, and a load M. The rectifying device 47 converts an alternating-current voltage output from the alternating-current power supply $V_{AC}$ to a direct-current voltage $V_{DC}$.

On the other hand, power is supplied to the load M from a wiring 4a connected to a node n1, which is a connection point of the switching element sw41 and the switching element sw44, a wiring 4b connected to a node n2, which is a connection point of the switching element sw42 and the switching element sw45, and a wiring 4c connected to a node n3, which is a connection point of the switching element sw43 and the switching element sw46.

The U-phase switching element sw41 includes an IGBT 4u and a diode Du. The V-phase switching element sw42 includes an IGBT 4v and a diode Dv. The W-phase switching element sw43 includes an IGBT 4w and a diode Dw.

The X-phase switching element sw44 includes an IGBT 4x and a diode Dx. The Y-phase switching element sw45 includes an IGBT 4y and a diode Dy. The Z-phase switching element sw46 includes an IGBT 4z and a diode Dz.

Furthermore, control circuits 41, 42, and 43 which exercise drive control or the like of the switching elements sw41, sw42, and sw43, respectively, are located. Control circuits 44, 45, and 46 which exercise drive control or the like of the switching elements sw44, sw45, and sw46, respectively, are located. In addition, the controller 40 which exercises batch control of the control circuits 41 through 46 is located. For example, each of the control circuits 41 through 46 has the function of the control circuit 20-1, 20-2, 20-3, or 20-4 described in FIG. 8, 14, 15, or 16.

Each component is connected in the following way. A positive electrode side terminal of the rectifying device 47 is connected to one end of the smoothing capacitor C0, a collector of the IGBT 4u, a cathode of the diode Du, a collector of the IGBT 4v, a cathode of the diode Dv, a collector of the IGBT 4w, and a cathode of the diode Dw.

A negative electrode side terminal of the rectifying device 47 is connected to the other end of the smoothing capacitor C0, an emitter of the IGBT 4x, an anode of the diode Dx, an emitter of the IGBT 4y, an anode of the diode Dy, an emitter of the IGBT 4z, and an anode of the diode Dz.

A gate of the IGBT 4u is connected to the control circuit 41. An anode of the diode Du is connected to an emitter of the IGBT 4u, the control circuit 41, and the node n1. The node n1 is connected to the load M, a collector of the IGBT 4x, and a cathode of the diode Dx.

A gate of the IGBT 4v is connected to the control circuit 42. An anode of the diode Dv is connected to an emitter of the IGBT 4v, the control circuit 42, and the node n2. The node n2 is connected to the load M, a collector of the IGBT 4y, and a cathode of the diode Dy.

A gate of the IGBT 4w is connected to the control circuit 43. An anode of the diode Dw is connected to an emitter of the IGBT 4w, the control circuit 43, and the node n3. The node n3 is connected to the load M, a collector of the IGBT 4z, and a cathode of the diode Dz.

The controller 40 inputs a gate input signal Vin-u to the control circuit 41, inputs a gate input signal Vin-v to the control circuit 42, and inputs a gate input signal Vin-w to the control circuit 43. Similarly, the controller 40 inputs a gate input signal Vin-x to the control circuit 44, inputs a gate input signal Vin-y to the control circuit 45, and inputs a gate input signal Vin-z to the control circuit 46.

As has been described in the foregoing, a short-circuit current and noise are suppressed when a semiconductor device according to the present disclosure is operated again. For example, it is assumed that a short circuit occurs in the semiconductor device and that the semiconductor device stops. Since the occurrence of the short circuit in the semiconductor device leads to releasing a latch state of the latch circuit 21a, an output of the latch circuit 21a becomes L level.

It is assumed that after that the main cause of an alarm is removed and that the semiconductor device resumes operation. Even if at this time a short circuit occurs again in the semiconductor device, an output of the latch circuit 21a is at the L level. As a result, the switch sw2 turns on and a small driving current flows through the gate of the IGBT 11. Accordingly, when the semiconductor device resumes operation, an increase in short-circuit current is suppressed. Furthermore, even when the semiconductor device performs normal operation, at initial operation time, the gate of the IGBT 11 is charged with a small driving current to drive the IGBT 11. As a result, noise is suppressed.

The embodiment has been taken as an example. The structure of each section indicated in the embodiment may be replaced by another structure having the same function. For example, a wide-band-gap semiconductor, such as silicon carbide (SiC), may be used for forming a switching element. Furthermore, any other component or process may be added. Moreover, the structures (features) of any two or more of the above embodiments may be combined.

According to an aspect, a short-circuit current and noise are suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a switching element configured to perform a switching on a basis of an input signal to operate a load;
   a detection circuit configured to output a release signal upon detecting a predetermined state of the switching element; and
   a driving current control circuit including a latch circuit configured to latch a data signal that depends on a magnitude of a current flowing through the switching element and to output a latched data signal in accordance with the input signal,
   wherein the driving current control circuit is configured to output, on a basis of an output of the latch circuit, a driving current for charging a gate capacitance of the switching element in an operation state of the semiconductor device,
   wherein the latch circuit is configured to receive the release signal from the detection circuit and to reset the output thereof upon receiving the release signal from the detection circuit, and
   wherein the driving current control circuit sets the driving current such that:
   (i) upon detecting that a current flowing through the switching element is less than a switching current value, the driving current control circuit sets the driving current to a first driving current;
   (ii) upon detecting that the current flowing through the switching element is greater than the switching current value, the driving current control circuit sets the driving current to a second driving current that is larger than the first driving current; and
   (iii) upon the latch circuit receiving the release signal, the driving current control circuit sets the driving current to the first driving current.

2. The semiconductor device according to claim 1, wherein:

the predetermined state is at least one of an overcurrent state of the switching element in which an overcurrent flows through the switching element, an overheat state of the switching element in which the switching element is overheated, or a device power source voltage drop state in which a power voltage of the semiconductor device is lower than a predetermined level; and the detection circuit, upon detecting the predetermined state, outputs the release signal to the latch circuit, the release signal being also output to an outside of the semiconductor device to inform the predetermined state being detected, and being used to stop driving of the switching element.

3. The semiconductor device according to claim 1, wherein:

the predetermined state is an overcurrent state of the switching element in which an overcurrent flows through the switching element; and the detection circuit, upon detecting the overcurrent state, outputs the release signal to the latch circuit, the release signal being also used to stop driving of the switching element.

4. The semiconductor device according to claim 1, wherein:

the predetermined state is an overcurrent state of the switching element in which a current flowing through the switching element is equal to or greater than a predetermined current; and the detection circuit, upon detecting the overcurrent state, outputs the release signal to the latch circuit.

5. The semiconductor device according to claim 1, wherein:

the predetermined state is a state in which the current flowing through the switching element is equal to or greater than a predetermined current and in which a driving voltage input to the switching element is equal to or greater than a predetermined voltage; and the detection circuit, upon detecting the predetermined state, outputs the release signal to the latch circuit.

6. The semiconductor device according to claim 1, wherein the driving current control circuit further includes a switching current detection circuit configured to detect whether or not the current flowing through the switching element is greater than the switching current value, and output a first switching signal in response to detecting that the current is less than the switching current value and a second switching signal in response to detecting that the current is greater than the switching current value, the latch circuit latching the detection result obtained from the first or second switching signal;

a selection circuit configured to output, on a basis of the output from the latch circuit, a selection signal for setting the driving current to either the first driving current or the second driving current; and a driving current output circuit configured to output the first driving current or the second driving current on a basis of the selection signal.

7. The semiconductor device according to claim 6, wherein:

the latch circuit, on a basis of the input signal, latches the detection result obtained from the first or second switching signal to output the detection result as the output of the latch circuit, or outputs a latch release output signal as the output of the latch circuit upon receiving the release signal, the selection circuit outputs a first selection signal upon receiving the output of the latch circuit obtained from the first switching signal or upon receiving the latch release output signal, and outputs a second selecting signal upon receiving the output of the latch circuit obtained from the second switching signal, and to charge the gate capacitance of the switching element, the driving current output circuit outputs the first driving current upon receiving the first selection signal or the latch release output signal and outputs the second driving current upon receiving the second selection signal.

8. The semiconductor device according to claim 6, wherein the switching element is included in one of upper arm and lower arm, and a boundary value between a first current region, when the first current region includes a maximum value of a voltage change rate of a switching element of the other one of the upper arm and lower arm when a diode of the other arm performs a recovery operation when the switching element of the one arm is turned on, of the current flowing through the switching element of the one arm and a second current region, when the second current region does not include the maximum value, and of the current flowing through the switching element of the one arm is set as the switching current value.

9. A semiconductor device, comprising:

a switching element configured to perform a switching on a basis of an input signal to operate a load;

a state detection circuit configured to output a release signal upon detecting a predetermined state of the switching element; and a driving current control circuit including a switching current detection circuit configured to detect whether or not a current flowing through the switching element is greater than a switching current value, and a latch circuit configured to latch a data signal that depends on a magnitude of the current flowing through the switching element and to output a latched data signal in accordance with the input signal, wherein the driving current control circuit is configured to output, on a basis of an output of the latch circuit, a driving current for charging a gate capacitance of the switching element in an operation state of the semiconductor device, wherein the latch circuit is configured to receive the release signal from the state detection circuit and to reset the output thereof upon receiving the release signal from the state detection circuit, and wherein the driving current control circuit sets the driving current such that:

(i) upon the switching current detection circuit detecting that the current flowing through the switching element is less than a switching current value, the driving current control circuit sets the driving current to a first driving current;

(ii) upon the switching current detection circuit detecting that the current flowing through the switching element is greater than the switching current value, the driving current control circuit sets the driving current to a second driving current that is larger than the first driving current; and (iii) upon the latch circuit receiving the release signal output from the state detection circuit, the driving current control circuit sets the driving current to the first driving current.

\* \* \* \* \*